United States Patent
Suzuki et al.

(10) Patent No.: US 6,710,930 B2
(45) Date of Patent: Mar. 23, 2004

(54) ILLUMINATION OPTICAL SYSTEM AND METHOD OF MAKING EXPOSURE APPARATUS

(75) Inventors: Takeshi Suzuki, Kawasaki (JP); Issey Tanaka, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/237,685

(22) Filed: Sep. 10, 2002

(65) Prior Publication Data

US 2003/0063394 A1 Apr. 3, 2003

Related U.S. Application Data

(63) Continuation of application No. 09/691,194, filed on Oct. 19, 2000, now abandoned.
(60) Provisional application No. 60/217,659, filed on Jul. 10, 2000.

(30) Foreign Application Priority Data

Dec. 1, 1999 (JP) .............................. 11-342621

(51) Int. Cl.⁷ .............................. G02B 9/00; G01B 9/00; G01N 21/41
(52) U.S. Cl. .................... 359/649; 356/124; 356/128; 359/648
(58) Field of Search .................. 359/648, 649; 356/124, 128

(56) References Cited

U.S. PATENT DOCUMENTS

| | | | | |
|---|---|---|---|---|
| 4,871,237 A | * | 10/1989 | Anzi et al. | 359/666 |
| 5,410,428 A | * | 4/1995 | Yamagata et al. | 359/350 |
| 5,699,183 A | * | 12/1997 | Hiraiwa et al. | 359/355 |
| 5,719,698 A | | 2/1998 | Hiraiwa et al. | 359/355 |
| 5,831,770 A | | 11/1998 | Matsuzawa et al. | 359/649 |
| 5,903,400 A | | 5/1999 | Endo | 359/758 |
| 6,025,955 A | | 2/2000 | Hiraiwa et al. | 359/355 |
| 6,104,544 A | | 8/2000 | Matsuzawa et al. | 359/649 |
| 6,189,339 B1 | | 2/2001 | Hiraiwa | 65/17.3 |
| 6,201,634 B1 | | 3/2001 | Sakuma et al. | 359/322 |
| 6,262,793 B1 | | 7/2001 | Sasaya et al. | 355/53 |
| 6,366,404 B1 | | 4/2002 | Hiraiwa et al. | 359/494 |
| 6,377,333 B1 | | 4/2002 | Chiba et al. | 355/53 |
| 6,522,386 B1 | | 2/2003 | Nishi | 355/52 |
| 2003/0063394 A1 | * | 4/2003 | Suziki et al. | 359/649 |

FOREIGN PATENT DOCUMENTS

| | | | |
|---|---|---|---|
| EP | 0 660 169 B1 | 4/2000 | |
| EP | 1 114 802 A1 | 7/2001 | |
| JP | A 10-125588 | 5/1988 | |
| JP | 08-107060 | 4/1996 | |
| JP | 8-203805 | 8/1996 | |
| JP | A 10-133105 | 5/1998 | |
| JP | A 10-142501 | 5/1998 | |
| JP | A 10-154657 | 6/1998 | |
| JP | 11-45842 | 2/1999 | |
| JP | 11-054411 | 2/1999 | |
| JP | P2000-249917 A | * 9/2000 | ........ G02B/13/24 |

OTHER PUBLICATIONS

Hoffman et al. "Technological Methods for Suppressing the Effect of Surface Errors in Precision Optical Components Used in High–Performance Optics," Jahrbuch Für Optik Und Fein–Mechanik, pp. 45–83, 1993 w/ English translation.

* cited by examiner

*Primary Examiner*—David N. Spector
(74) *Attorney, Agent, or Firm*—Oliff & Berridge, PLC

(57) ABSTRACT

In a projection optical system for projecting and transferring a pattern on a projection original R onto a photosensitive substrate W, one or a plurality of lenses having an in-homogeous radial refractive index about the optical axis are used, while one or a plurality of aspheric surfaces for correcting the aberration resulting from the in-homogeousness in refractive index of lenses are provided.

84 Claims, 16 Drawing Sheets

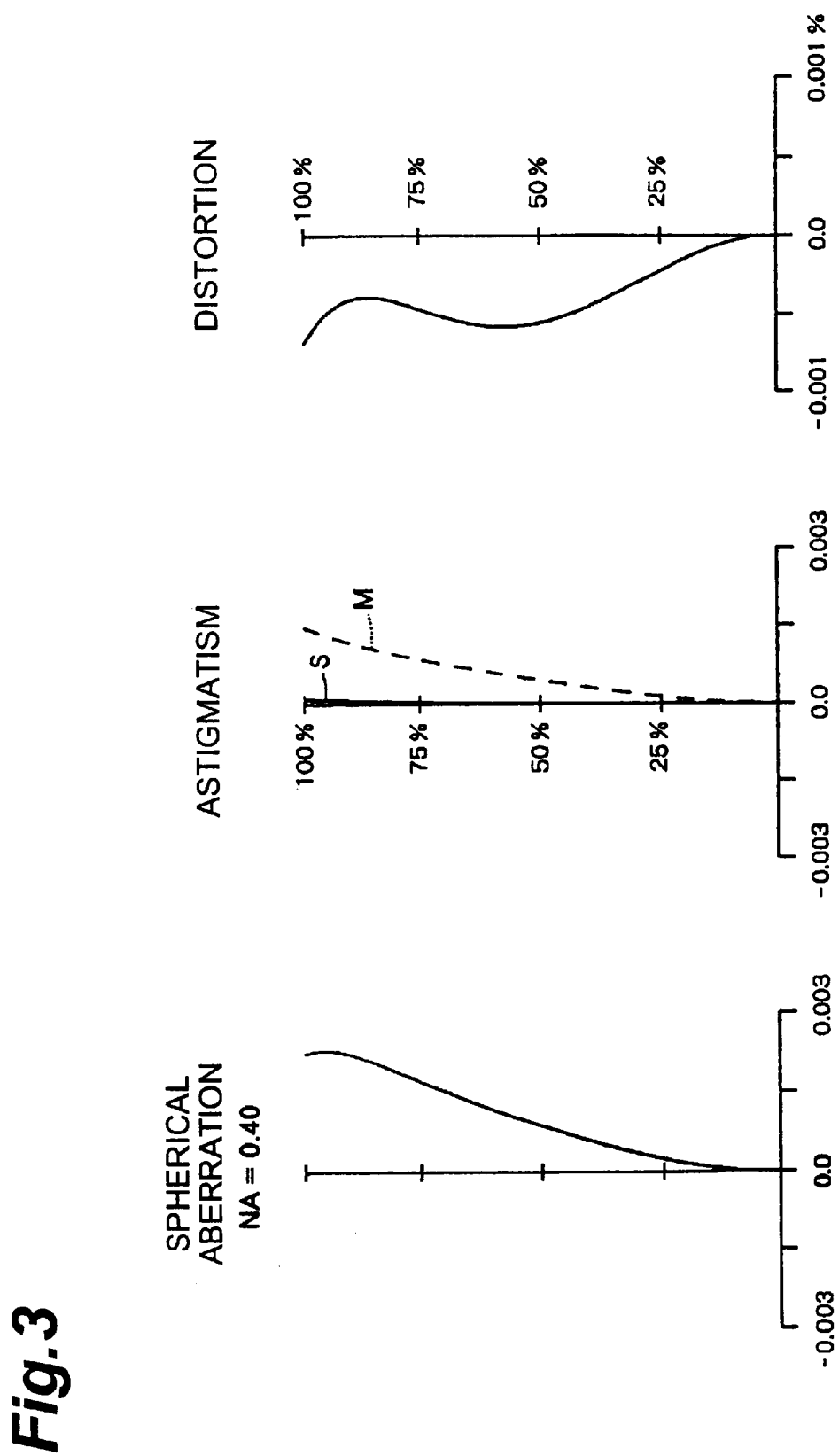

*Fig.6A* *Fig.6B*
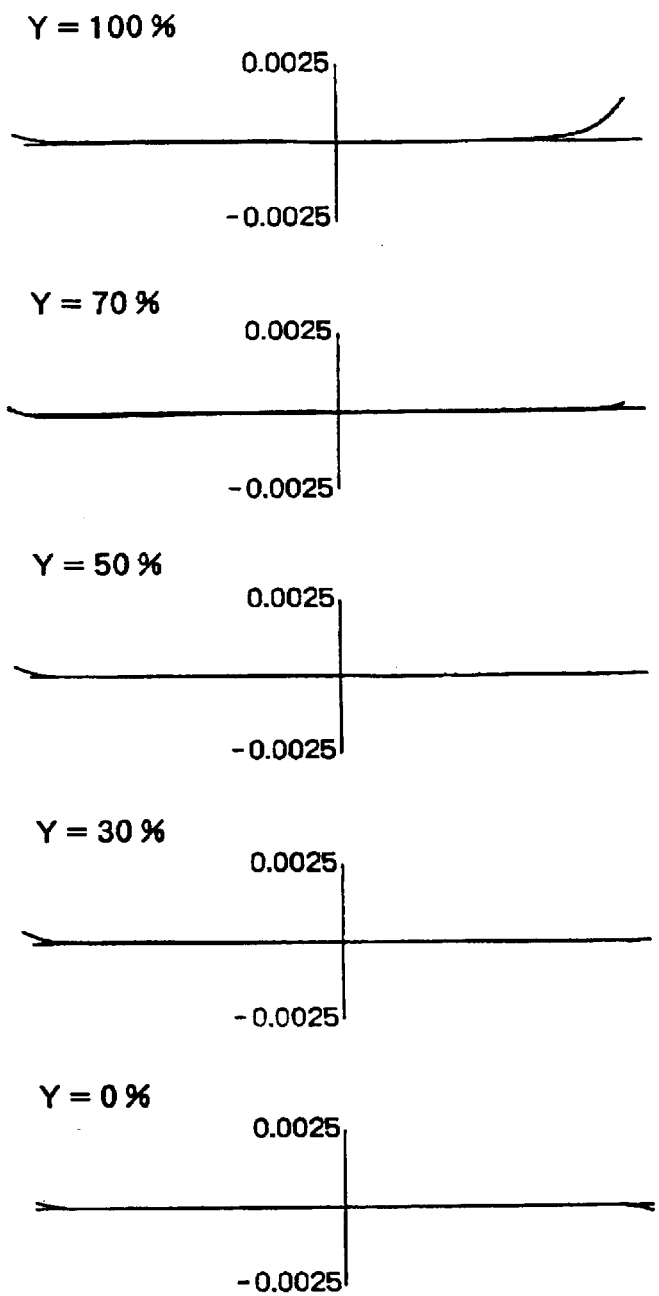
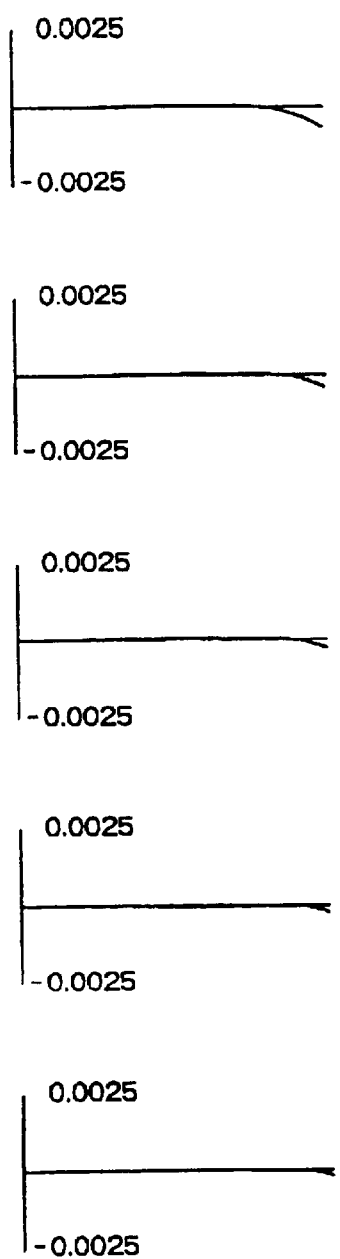

*Fig.8A* *Fig.8B*
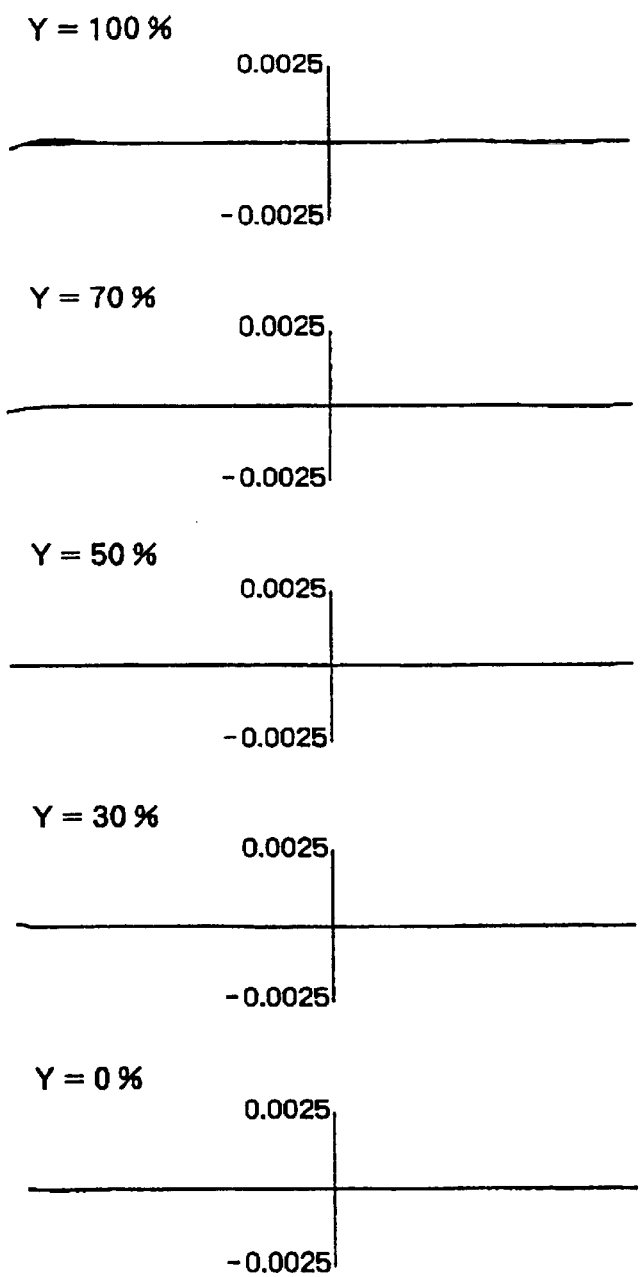
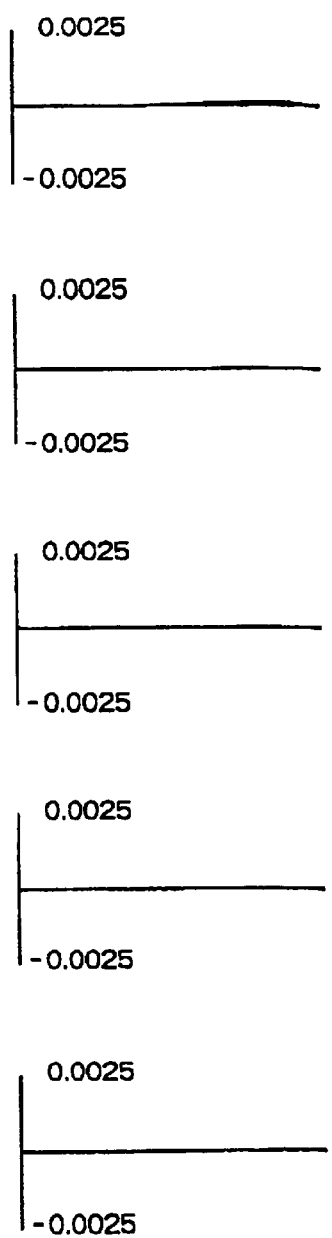

ILLUMINATION OPTICAL SYSTEM AND METHOD OF MAKING EXPOSURE APPARATUS

This is a Continuation of application Ser. No. 09/691,194 filed Oct. 19, 2000 (abandoned), and claims the benefit of provisional application No. 60/217,659 filed Jul. 10, 2000. The entire disclosure of the prior application(s) is hereby incorporated by reference herein in its entirety.

BACKGROUD OF THE INVENTION

1. Field of the Invention

The present invention relates to an optical system using one or a plurality of optical members (lens and the like) having an uneven optical characteristics (e.g., uneven radial refractive index about an optical axis); and, in particular, to a projection optical system for projecting and transferring a pattern on a projection original onto a photosensitive substrate, or an illumination optical system for illuminating the projection original. Further, the present invention relates to a method of making a projection optical system, a method of making an illumination optical system, a method of making an exposure apparatus, an exposure method, and a method of making a micro device.

2. Related Background Art

In a step of making a semiconductor circuit device, a liquid crystal display device, or the like, an exposure apparatus is used. This exposure apparatus is an apparatus for projecting and transferring a pattern on a projection original such as reticle or mask onto a photosensitive substrate such as wafer or glass plate byway of a projection optical system. In order to project a fine mask pattern onto the photosensitive substrate, the projection optical system requires a very high optical performance in that it has a high resolution with nearly no aberration.

Hence, in order to correct the aberration resulting from a manufacturing error upon assembling the projection optical system, the thickness or the like of washers in the lens barrel for holding optical members such as lens has been changed, lens surfaces have been reground, and so forth.

For achieving a higher accuracy and larger NA in the projection optical system, the in-homogeneousness in refractive index within the lenses has been becoming a factor which is not negligible. The in-homogeneousness in refractive index within the lenses cannot be neglected in particular when there are a large number of constituent lenses.

This in-homogeneousness in refractive index within lenses cannot be corrected by changing the thickness or the like of washers or repolishing lens surfaces. Therefore, it has conventionally been impossible to make lenses from ingots of lenses which do not fall within a tolerance for use.

However, if ingots whose evenness of refractive index does not fall within the tolerance for use are discarded, then the efficiency of making lenses will decrease, thus lowering the efficiency of making projection optical systems. This problem relates to not only the making of projection optical systems, but also the making of illumination optical systems or the making of various kinds of apparatus such as inspection apparatus requiring high optical performances.

SUMMARY OF INVENTION

It is an object of the present invention to provide methods of making various kinds of optical systems such as projection optical systems which use one or a plurality of optical members (lens and the like) having an uneven refractive index and can secure required optical performances, and methods of making various kinds of apparatus.

In most of lenses having an uneven refractive index, the in-homogeneousness of refractive index is distributed in the radial direction, whereas the refractive index is uniform in the circumferential direction. Taking account of this point, the present invention overcomes the above-mentioned problem. Namely, it provides an optical system using one or a plurality of lenses whose radial refractive index about an optical axis is uneven, and having one or a plurality of aspheric surfaces for correcting an aberration caused by the in-homogeneousness of refractive index in the lenses. Preferably, the optical system is a projection optical system for projecting and transferring a pattern on a projection original onto a photosensitive substrate or an illumination optical system for illuminating the projection original, for example.

Thus, the present invention corrects the aberration deteriorated due to the use of lenses having an uneven refractive index distribution by employing aspheric surfaces.

Preferably, in the present invention, each of the lenses with the uneven refractive index has the following relationship:

[Expression 1]

$$n_{max} - n_{min} > 1 \times 10^{-7} \tag{1}$$

where $n_{max}$ is the maximum value of refractive index, and $n_{min}$ is the minimum value of refractive index. Namely, it is preferred that, if (1) is satisfied, then the lens be considered to have an uneven refractive index, and its resulting aberration be corrected by an aspheric surface.

Conversely, if the degree of in-homogeneousness in refractive index is outside of the range according to expression (1), then the refractive index distribution of the lens can be considered substantially uniform. Hence, if the aberration resulting from such a lens is to be corrected by an aspheric surface, then the difference between the aspheric surface and spherical surface (sag amount) becomes so small that it will be meaningless to introduce the aspheric surface.

Preferably, the projection optical system of the present invention is constituted, successively from the projection original side, by a first lens group having a positive refracting power, a second lens group having a negative refracting power, a third lens group having a positive refracting power, a fourth lens group having a negative refracting power, a fifth lens group having a positive refracting power, and a sixth lens group having a positive refracting power.

The first lens group having a positive refracting power mainly contributes to correction of distortion, while maintaining a telecentric property on the object side. Namely, a positive distortion is generated by the first lens group, so as to keep a balance with the negative distortion generated by the second and fourth lens groups.

The second and fourth lens groups having a negative refracting power mainly contribute to correction of Petzval sum. The second and third lens groups form an inverted Galilean system and not only adjusts magnification but also contributes to securing a back focus in the projection optical system.

The fifth and sixth lens groups having a positive refracting power contributes to restraining distortion from occurring and, in particular, to restraining spherical aberration from occurring.

In the case where the projection optical system has the six-group configuration mentioned above, it preferably satisfies:

[Expression 2]

$$0.04 < |f_4|/L < 0.2 \quad (2)$$

$$0.02 < f_5/L < 0.9 \quad (3)$$

$$0.02 < f_6/L < 1.5 \quad (4)$$

$$D_{56}/L < 0.3 \quad (5)$$

$$0.5 < D_6/R_6 < 1.5 \quad (6)$$

Here, $f_i$ is the focal length of the i-th lens group (i=4, 5, 6);

L is the distance from the object surface to the image plane on the optical axis;

$D_{56}$ is the interval between the fifth and sixth lens groups;

$D_6$ is the distance from the lens surface closest to the object in the sixth lens group to the image plane on the optical axis; and $R_6$ is the radius of curvature of the lens surface closest to the object in the sixth lens group on the optical axis.

Conditional expression (2) relates to the balance between spherical aberration and coma. If the lower limit of conditional expression (2) is not satisfied, then aspherical aberration is harder to correct, and it becomes further difficult to use a lens having an uneven refractive index. If its upper limit is exceeded, by contrast, then coma occurs, and it also becomes difficult to use a lens with an uneven refractive index.

Conditional expression (3) relates to a balance among spherical aberration, distortion, and Petzval sum. If the lower limit of conditional expression (3) is not satisfied, then negative distortion and negative spherical aberration enhance, and it becomes further difficult to use a lens with an uneven refractive index. If its upper limit is exceeded, by contrast, then it becomes harder to correct Petzval sum favorably, and it also becomes difficult to use a lens with an uneven refractive index.

Conditional expression (4) relates to the balance between higher-order spherical aberration and negative distortion. If the lower limit of conditional expression (4) is not satisfied, then negative distortion and negative spherical aberration enhance, and it becomes further difficult to use a lens with an uneven refractive index. If its upper limit is exceeded, by contrast, then higher-order spherical aberration occurs, and light beams pass through the lenses at acute angles, whereby it also becomes difficult to use a lens with an uneven refractive index.

If the upper limit of conditional expression (5) is exceeded, then the lens interval between the fifth and sixth lens groups increases so that not only the positive distortion is weakened, but also the influence of light beams being emitted at acute angles generates further higher-order spherical aberration or the like, which is harder to correct.

If the lower limit of conditional expression (6) is not satisfied, then the positive refracting power of the lens surface closest to the object in the sixth lens group becomes so strong that negative distortion and coma enhance, and it becomes further difficult to use a lens with an uneven refractive index. If its upper limit is exceeded, by contrast, then coma occurs greatly, and it also becomes difficult to use a lens with an uneven refractive index.

Next, when the projection optical system has the above-mentioned six-group configuration, it is preferred that at least one of a lens surface of a lens belonging to the first lens group and a lens surface of the lens disposed closest to the first lens group in the second lens group be formed by the aspheric surface and satisfy the following condition:

[Expression 3]

$$|Df - Db| > 0.1 \quad (7)$$

where $Df = Rf \cdot \sin wf \cdot \lambda/(NA \cdot Y_{max})$;

$Db = Rb \cdot \sin wb \cdot \lambda/(NA \cdot Y_{max})$;

Rf is the radius of the wavefront form with respect to the maximum image height concerning a system in which the aspheric surface is replaced by a spherical surface (absolute amount of image plane incident angle);

wf is the incident azimuth of the wavefront form with respect to the maximum image height concerning the system in which the aspheric surface is replaced by a spherical surface;

Rb is the radius of the wavefront form with respect to the maximum image height concerning a system employing the aspheric surface (absolute amount of image plane incident angle);

wb is the incident azimuth of the wavefront form with respect to the maximum image height concerning the system in which the aspheric surface is employed;

$\lambda$ is the wavelength in use;

NA is the maximum numerical aperture on the image side; and $Y_{max}$ is the maximum image height.

The above-mentioned conditional expression (7) is a conditional expression for efficiently correcting various kinds of aberration deteriorated due to the use of lenses having an in-homogeneousness in refractive index. In particular, it is a conditional expression for contributing to correction of distortion by forming at least one of a lens surface of a lens belonging to the first lens group and a lens surface of the lens disposed closest to the first lens group in the second lens group into the aspheric surface.

If the lower limit of conditional expression (7) is not satisfied, then the distortion deteriorated due to the use of a lens with an in-homogeneousness in refractive index is not so deteriorated in reality, whereby it is meaningless to introduce the aspheric surface at the position mentioned above; or the distortion is not efficiently corrected though it is deteriorated to a certain extent, whereby the difference between the aspheric surface and spherical surface (sag amount) is so small that it is meaningless to introduce the aspheric surface.

Also, when the projection optical system has the above-mentioned six-group configuration, it is preferred that at least one of a lens surface of a lens belonging to the second lens group and a lens surface of the lens disposed closest to the second lens group in the third lens group be formed by the aspheric surface and satisfy the following condition:

[Expression 4]

$$|Af - Ab| > 0.02 \quad (8)$$

Here, $Af = (4Rf^4 - 3Rf^2)\cos 2wf \cdot \lambda/(NA \cdot Y_{max})$; and $Ab = (4Rb^4 - 3Rb^2)\cos 2wb \cdot \lambda/(NA \cdot Y_{max})$.

The above-mentioned conditional expression (8) is a conditional expression for efficiently correcting various kinds of aberration deteriorated due to the use of lenses having an in-homogeneousness in refractive index. In particular, it is a conditional expression for contributing to correction of the fifth-order astigmatic difference by forming at least one of a lens surface of a lens belonging to the second lens group and a lens surface of the lens disposed closest to the second lens group in the third lens group into the aspheric surface.

If the lower limit of conditional expression (8) is not satisfied, then the astigmatic difference deteriorated due to the use of a lens with an in-homogeneousness in refractive index is not so deteriorated in reality, whereby it is meaningless to introduce the aspheric surface at the position mentioned above; or the astigmatic difference is not efficiently corrected though it is deteriorated to a certain extent, whereby the difference between the aspheric surface and spherical surface (sag amount) is so small that it is meaningless to introduce the aspheric surface.

Also, when the projection optical system has the above-mentioned six-group configuration, it is preferred that at least one lens surface of lenses belonging to the third and fourth lens groups be formed by the aspheric surface and satisfy the following condition:
[Expression 5]

$$|Cf-Cb|>0.06 \qquad (9)$$

Here, $Cf=(10Rf^5-12Rf^3+3Rf)\sin wf\times\lambda/(NA\cdot Y_{max})$; and
$Cb=(10Rb^5-12Rb^3+3Rb)\sin wb\times\lambda/(NA\cdot Y_{max})$.

The above-mentioned conditional expression (9) is a conditional expression for efficiently correcting various kinds of aberration deteriorated due to the use of lenses having an in-homogeneousness in refractive index. In particular, it is a conditional expression for contributing to correction of coma by forming at least one lens surface of lenses belonging to the third and fourth lens groups into the aspheric surface.

If the lower limit of conditional expression (9) is not satisfied, then the coma deteriorated due to the use of a lens with an in-homogeneousness in refractive index is not so deteriorated in reality, whereby it is meaningless to introduce the aspheric surface at the position mentioned above; or the coma is not efficiently corrected though it is deteriorated to a certain extent, whereby the difference between the aspheric surface and spherical surface (sag amount) is so small that it is meaningless to introduce the aspheric surface.

Also, when the projection optical system has the above-mentioned six-group configuration, it is preferred that at least one lens surface of lenses belonging to the fifth and sixth lens groups be formed by the aspheric surface and satisfy the following condition:
[Expression 6]

$$|Sf-Sb|>0.02 \qquad (10)$$

Here, $Sf=(20Rf^6-30Rf^4+12Rf^2-1)\cdot\lambda/(NA\cdot Y_{max})$; and
$Sb=(20Rb^6-30Rb^4+12Rb^2-1)\cdot\lambda/(NA\cdot Y_{max})$.

The above-mentioned conditional expression (10) is a conditional expression for efficiently correcting various kinds of aberration deteriorated due to the use of lenses having an in-homogeneousness in refractive index. In particular, it is a conditional expression for contributing to correction of the fifth-order spherical aberration by forming at least one lens surface of lenses belonging to the fifth and sixth lens groups into the aspheric surface.

If the lower limit of conditional expression (10) is not satisfied, then the spherical aberration deteriorated due to the use of a lens with an in-homogeneousness in refractive index is not so deteriorated in reality, whereby it is meaningless to introduce the aspheric surface at the position mentioned above; or the spherical aberration is not efficiently corrected though it is deteriorated to a certain extent, whereby the difference between the aspheric surface and spherical surface (sag amount) is so small that it is meaningless to introduce the aspheric surface.

Further, an object of the invention is to provide a method of making a projection optical system for projecting an image of a predetermined pattern formed on a projection original onto a photosensitive substrate, the method having: a first step of measuring an in-homogeneousness in refractive index of a plurality of dioptric optical members; a second step of calculating an aberration generated by a dioptric optical member having an in-homogeneousness in refractive index; a third step of computing an aspheric surface form which can correct the aberration calculated by the second step; a fourth step of giving the aspheric surface form computed by the third step to the dioptric optical member; and a fifth step of assembling the dioptric optical members.

Here, it is preferred that the in-homogeneousness in refractive index be a radial refractive index distribution about an optical axis, and that the aspheric surface form have rotational symmetry about the optical axis.

Further object of the present invention is to provide a method of making a projection optical system for projecting an image of a predetermined pattern formed on a projection original onto a photosensitive substrate, the method including: a first measuring step for measuring an in-homogeneousness in refractive index of a plurality of dioptric optical members; a processing step for processing the plurality of dioptric optical members after the first measuring step; a second measuring step for measuring a processed surface form of the plurality of dioptric optical members after the processing step; an assembling step for assembling the projection optical system by using the plurality of dioptric optical members after the second measuring step; a third measuring step for measuring an unnecessary optical characteristics remaining in the projection optical system after the assembling step; a computing step for computing a correction surface form concerning at least one processed surface in the plurality of dioptric optical members according to respective items of measurement information obtained by the first, second, and third measuring steps in order to correct the unnecessary optical characteristics remaining in the projection optical system; a reprocessing step for reprocessing at least one processed surface in the plurality of dioptric optical members according to information concerning the correction surface form obtained by the computing step; and a finishing step for completing the projection optical system by using a dioptric optical member reprocessed by the reprocessing step and a dioptric optical member processed by the processing step or by using a dioptric optical member reprocessed by the reprocessing step.

Further object of the present invention is to provide a method of making a projection optical system for projecting an image of a predetermined pattern formed on a projection original onto a photosensitive substrate, the method including: a first measuring step for measuring an in-homogeneousness in refractive index of a plurality of dioptric optical members; a processing step for processing the plurality of dioptric optical members after the first measuring step; a second measuring step for measuring a processed surface form ofs of the plurality of dioptric optical members after the processing step; a computing step for computing a correction surface form concerning at least one processed surface in the plurality of dioptric optical members according to respective items of measurement information obtained by the first and second measuring steps in order to correct an unnecessary optical characteristics remaining in the projection optical system which occurs due to the in-homogeneousness in refractive index of the plurality of dioptric optical members and a processing error in processed surfaces of the plurality of dioptric optical members; a reprocessing step for reprocessing at least one processed surface in the plurality of dioptric optical members according to information concerning the correction surface form obtained by the computing step; and a finishing step for completing the projection optical system by using a dioptric optical member reprocessed by the reprocessing step and a dioptric optical member processed by the processing step or by using a dioptric optical member reprocessed by the reprocessing step.

Preferably, in each of the foregoing methods of making a projection optical system, the computing step further computes the correction surface form by using optical design information of the projection optical system. Also, the computing step may compute the correction surface form by using assembling information in the assembling step.

Desirably, in each of the foregoing methods of making a projection optical system, the computing step further computes the correction surface form by using assembling information in the assembling step.

Further, an object of the present invention is to provide a method of making an exposure apparatus, the method including: a step of preparing a projection optical system made by any of the foregoing methods of making the projection optical system; a step of preparing an illumination optical system for illuminating the projection original; and a step of installing the illumination optical system and the projection optical system at predetermined positions such that the projection original is illuminated by the illumination optical system and that the image of the predetermined pattern formed on the projection original is projected onto the photosensitive substrate by the projection optical system.

More further, an object of the present invention is to provide a method of making an illumination optical system for illuminating an original in order to expose an image of a predetermined pattern formed on the original onto a photosensitive substrate, the method including: a first measuring step for measuring an in-homogeneousness in refractive index of a plurality of dioptric optical members; a processing step for processing the plurality of dioptric optical members after the first measuring step; a second measuring step for measuring a processed surface form of the plurality of dioptric optical members after the processing step; an assembling step for assembling the illumination optical system by using the plurality of dioptric optical members after the second measuring step; a third measuring step for measuring an unnecessary optical characteristics remaining in the illumination optical system after the assembling step; a computing step for computing a correction surface form concerning at least one processed surface in the plurality of dioptric optical members according to respective items of measurement information obtained by the first, second, and third measuring steps in order to correct the unnecessary optical characteristics remaining in the illumination optical system; a reprocessing step for reprocessing at least one processed surface in the plurality of dioptric optical members according to information concerning the correction surface form obtained by the computing step; and a finishing step for completing the illumination optical system by using a dioptric optical member reprocessed by the reprocessing step and a dioptric optical member processed by the processing step or by using a dioptric optical member reprocessed by the reprocessing step.

More further, an object of the present invention is to provide a method of making an illumination optical system for illuminating an original in order to expose an image of a predetermined pattern formed on the original onto a photosensitive substrate, the method including: a first measuring step for measuring an in-homogeneousness in refractive index of a plurality of dioptric optical members; a processing step for processing the plurality of dioptric optical members after the first measuring step; a second measuring step for measuring a processed surface form ofs of the plurality of dioptric optical members after the processing step; a computing step for computing a correction surface form concerning at least one processed surface in the plurality of dioptric optical members according to respective items of measurement information obtained by the first and second third measuring steps in order to correct an unnecessary optical characteristics remaining in the illumination optical system which occurs due to the in-homogeneousness in refractive index of the plurality of dioptric optical members and a processing error in processed surfaces of the plurality of dioptric optical members; a reprocessing step for reprocessing at least one processed surface in the plurality of dioptric optical members according to information concerning the correction surface form obtained by the computing step; and a finishing step for completing the illumination optical system by using a dioptric optical member reprocessed by the reprocessing step and a dioptric optical member processed by the processing step or by using a dioptric optical member reprocessed by the reprocessing step.

More further, an object of the present invention is to provide a method of making an exposure apparatus, the method including: a step of preparing an illumination optical system made by any of the foregoing methods of making the illumination optical system; a step of preparing a projection optical system for projecting the image of the pattern of the original onto the photosensitive substrate; and a step of installing the illumination optical system and the projection optical system at predetermined positions such that the original is illuminated by the illumination optical system and that the image of the predetermined pattern formed on the original is projected onto the photosensitive substrate by the projection optical system.

More further, an object of the present invention is to provide a method of making a micro device, the method including: a preparation step of preparing an exposure apparatus made by the foregoing method of making the exposure apparatus; an illumination step of illuminating the original by using the illumination optical system; an exposure step of exposing the image of the pattern of the original to the photosensitive substrate by using the projection optical system; and a development step of developing the photosensitive substrate exposed by the exposure step.

BRIEF DESCRIPTION OF DRAWINGS

FIG. 3 shows a chart showing spherical aberration, astigmatism, and distortion in the case where lenses with in-homogeous refractive index are used without introducing aspheric surfaces;

FIGS. 6A and 6B show charts showing lateral aberration in the case where lenses with in-homogeous refractive index is replaced by lenses with even refractive index;

FIGS. 8A and 8B show charts showing lateral aberration in the case where lenses with in-homogeous refractive index are used while introducing aspheric surfaces;

DESCRIPTION OF THE PREFERRED EMBODIMENTS

Figure 1:
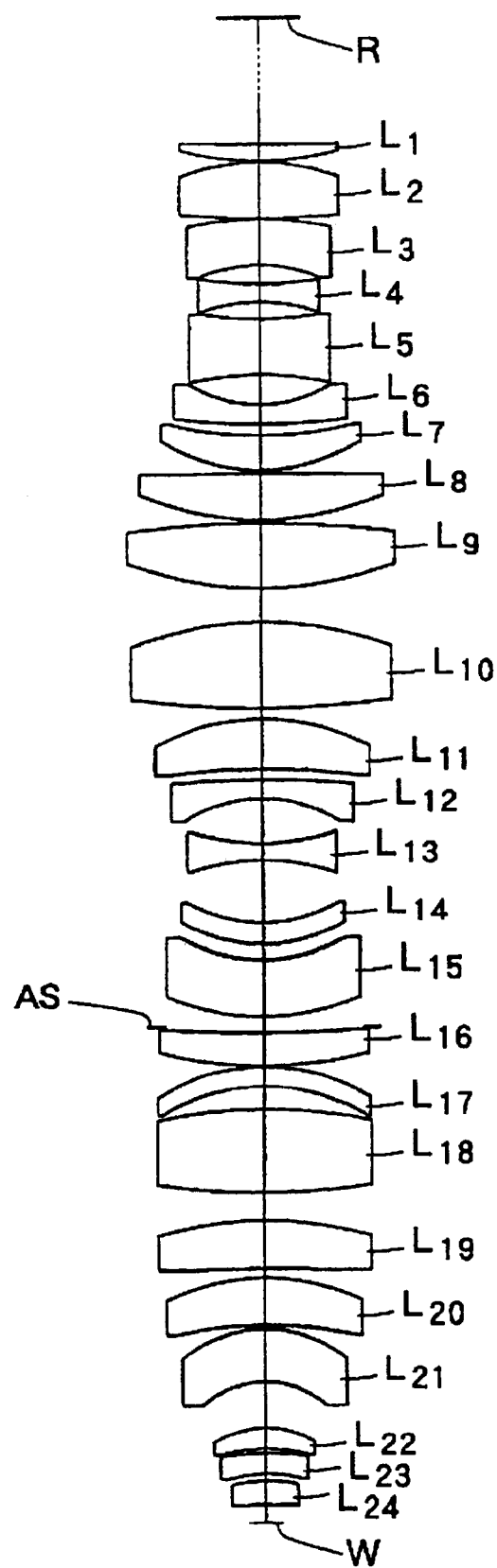
FIG. 1 is a sectional view showing an embodiment of the projection optical system in accordance with the present invention.

Modes for carrying out the present invention will be explained with reference to the drawings. FIG. 1 shows an embodiment of the projection optical system in accordance with the present invention, which projects and transfers a pattern on a reticle R onto a wafer W. This projection optical system is constituted, successively from the reticle R side, by a first lens group G1 having a positive refracting power, a second lens group G2 having a negative refracting power, a third lens group G3 having a positive refracting power, a fourth lens group G4 having a negative refracting power, a fifth lens group G5 having a positive refracting power, and a sixth lens group G6 having a positive refracting power.

The following Table 1 shows characteristics of this embodiment. In "Lens Specifications" of Table 1, the first column, No, refers to the number of each lens surface from the reticle R side; the second column, r, refers to the radius of curvature of each lens surface; the third column, d, refers to the distance from each lens surface to the next lens surface on the optical axis; and the fourth column refers to the number of lens (each blank indicating the air) filling the gap between each lens surface to the next lens surface.

The glass material for all the lenses is synthetic silica ($SiO_2$), and the refractive index n of synthetic silica at the wavelength in use ($\lambda$=248.4 nm) is:

n=1.508390

In this embodiment, a plurality of lenses each having an uneven radial refractive index about the optical axis are used. In this case, the refractive index n of the lens can be expressed as:

$$n = N_0 + N_2 \cdot r^2 + N_4 \cdot r^4 + N_6 \cdot r^6$$

where $N_i$ is a coefficient (i=0, 2, 4, 6); and r is the radius. "Refractive Index In-homogeneousness" in Table 1 shows the numbers of lenses having an uneven refractive index and coefficients $N_2$, $N_4$, $N_6$. Here, $N_0$=1.508390 in each lens.

Also, in this embodiment, a plurality of aspheric surfaces are arranged in order to correct the aberration resulting from the in-homogeneousness in refractive index of the lenses. The aspheric surface can be expressed as:

$$S(y) = \frac{y^2/r}{1 + \sqrt{1 - \kappa y^2/r^2}} + Ay^2 + By^4 + Cy^6 + Dy^8 \quad \text{[Expression 7]}$$

where

S(y) is the distance in the optical axis direction between the aspheric surface at a height y from the optical axis to the tangential plane;

r is the paraxial radius of curvature;

$\kappa$ is the conical constant; and

A, B, C, and D are aspheric surface coefficients. "Aspheric Surface Data" in Table 1 shows the numbers No of lens surfaces each employing an aspheric surface, and aspheric surface coefficients A, B, C, D. Here, the conical constant $\kappa$ is zero in each lens.

"Conditional Expression Corresponding Value" in Table 1 shows the respective values of parameters in each of the above-mentioned conditional expressions (1) to (10).

TABLE 1

[Main Characteristics]
Image-side Maximum Numerical Aperture NA = 0.4
Wavelength in Use $\lambda$ = 284.4 nm
L = 1300 mm
[Optical Member Characteristics]

| No | r | d | |
|---|---|---|---|
| 0 | ∞ | 110.813980 | R |
| 1 | −2567.05600 | 15.000000 | L1 |
| 2 | −256.49158 | 1.000000 | |
| 3 | 192.65125 | 48.637020 | L2 |
| 4 | −861.44884 | 1.000000 | |
| 5 | 302.52998 | 38.776880 | L3 |
| 6 | 128.72273 | 16.572980 | |
| 7 | −353.74446 | 15.000000 | L4 |
| 8 | 150.13109 | 14.747380 | |
| 9 | −331.08095 | 48.270620 | L5 |
| 10 | 250.11152 | 26.534840 | |
| 11 | −114.88270 | 16.523770 | L6 |
| 12 | −573.62319 | 10.858120 | |
| 13 | −298.86655 | 29.623950 | L7 |
| 14 | −159.62710 | 2.686350 | |
| 15 | 7690.88600 | 40.430120 | L8 |
| 16 | −273.30318 | 2.629440 | |
| 17 | 890.96746 | 57.543860 | L9 |
| 18 | −316.75427 | 29.181020 | |
| 19 | 305.13587 | 75.710690 | L10 |
| 20 | −824.24930 | 9.082970 | |
| 21 | 187.59132 | 44.228020 | L11 |
| 22 | 645.89151 | 9.034930 | |

TABLE 1-continued

| | | | |
|---|---|---|---|
| 23 | 916.25554 | 17.094670 | L12 |
| 24 | 123.79423 | 37.837060 | |
| 25 | −198.70066 | 15.000000 | L13 |
| 26 | 181.97835 | 53.670630 | |
| 27 | −123.95882 | 19.422800 | L14 |
| 28 | −134.17246 | 11.979610 | |
| 29 | −153.57992 | 50.555440 | L15 |
| 30 | −193.60916 | 8.435690 | |
| 31 | — | 4.831700 | AS |
| 32 | −1546.15700 | 29.450510 | L16 |
| 33 | −338.02569 | 1.000000 | |
| 34 | 177.03486 | 16.082190 | L17 |
| 35 | 170.58898 | 19.345880 | |
| 36 | 420.54438 | 72.696780 | L18 |
| 37 | −612.39548 | 22.671210 | |
| 38 | 312.58481 | 42.073550 | L19 |
| 39 | 7405.96400 | 6.578510 | |
| 40 | 194.28671 | 40.219410 | L20 |
| 41 | 390.43969 | 2.878850 | |
| 42 | 112.26513 | 46.114460 | L21 |
| 43 | 85.80816 | 37.732960 | |
| 44 | 81.95548 | 18.457720 | L22 |
| 45 | 148.20748 | 3.747730 | |
| 46 | 217.07589 | 17.236910 | L23 |
| 47 | 121.46206 | 5.875290 | |
| 48 | 125.09232 | 20.123380 | L24 |
| 49 | 1848.46800 | 15.000120 | |
| 50 | ∞ | | W |

[Refractive Index In-homogeneousness]

L2: $N_2 = -0.4648 \times 10^{-6}$; $N_4 = 0.2366 \times 10^{-11}$;
$N_6 = -0.2573 \times 10^{-14}$
L3: $N_2 = 0.8423 \times 10^{-6}$; $N_4 = -0.8087 \times 10^{-11}$;
$N_6 = 0.1387 \times 10^{-13}$
L5: $N_2 = 0.9916 \times 10^{-7}$; $N_4 = -0.1008 \times 10^{-9}$;
$N_6 = -0.1815 \times 10^{-13}$
L9: $N_2 = -0.2698 \times 10^{-6}$; $N_4 = -0.2239 \times 10^{-10}$;
$N_6 = 0.3818 \times 10^{-15}$
L10: $N_2 = 0.1714 \times 10^{-6}$; $N_4 = 0.1928 \times 10^{-10}$;
$N_6 = -0.3714 \times 10^{-15}$
L15: $N_2 = -0.8066 \times 10^{-7}$; $N_4 = 0.2175 \times 10^{-12}$;
$N_6 = 0.4227 \times 10^{-15}$
L18: $N_2 = 0.3448 \times 10^{-7}$; $N_4 = -0.2343 \times 10^{-11}$;
$N_6 = -0.2561 \times 10^{-15}$
L19: $N_2 = 0.1132 \times 10^{-6}$; $N_4 = -0.8997 \times 10^{-11}$;
$N_6 = 0.7126 \times 10^{-15}$
L21: $N_2 = -0.1266 \times 10^{-6}$; $N_4 = 0.5471 \times 10^{-10}$;
$N_6 = -0.5398 \times 10^{-15}$
L23: $N_2 = -0.1138 \times 10^{-5}$; $N_4 = 0.5058 \times 10^{-10}$;
$N_6 = 0.5378 \times 10^{-13}$

[Aspheric Surface Data]

| | | | |
|---|---|---|---|
| No = 1 | $A = 0.1349419 \times 10^{-9}$ | $B = -0.670357 \times 10^{-13}$ | |
| | $C = 0.141638 \times 10^{-16}$ | $D = -0.107368 \times 10^{-20}$ | |
| No = 7 | $A = -0.337203 \times 10^{-9}$ | $B = 0.210537 \times 10^{-12}$ | |
| | $C = -0.548794 \times 10^{-16}$ | $D = 0.516265 \times 10^{-20}$ | |
| No = 17 | $A = 0.165511 \times 10^{-10}$ | $B = -0.183674 \times 10^{-14}$ | |
| | $C = 0.108737 \times 10^{-18}$ | $D = -0.265080 \times 10^{-23}$ | |
| No = 32 | $A = 0.524400 \times 10^{-11}$ | $B = -0.231700 \times 10^{-15}$ | |
| | $C = 0.545900 \times 10^{-20}$ | $D = -0.529700 \times 10^{-25}$ | |

[Conditional Expression Corresponding Value]

Figure 2:
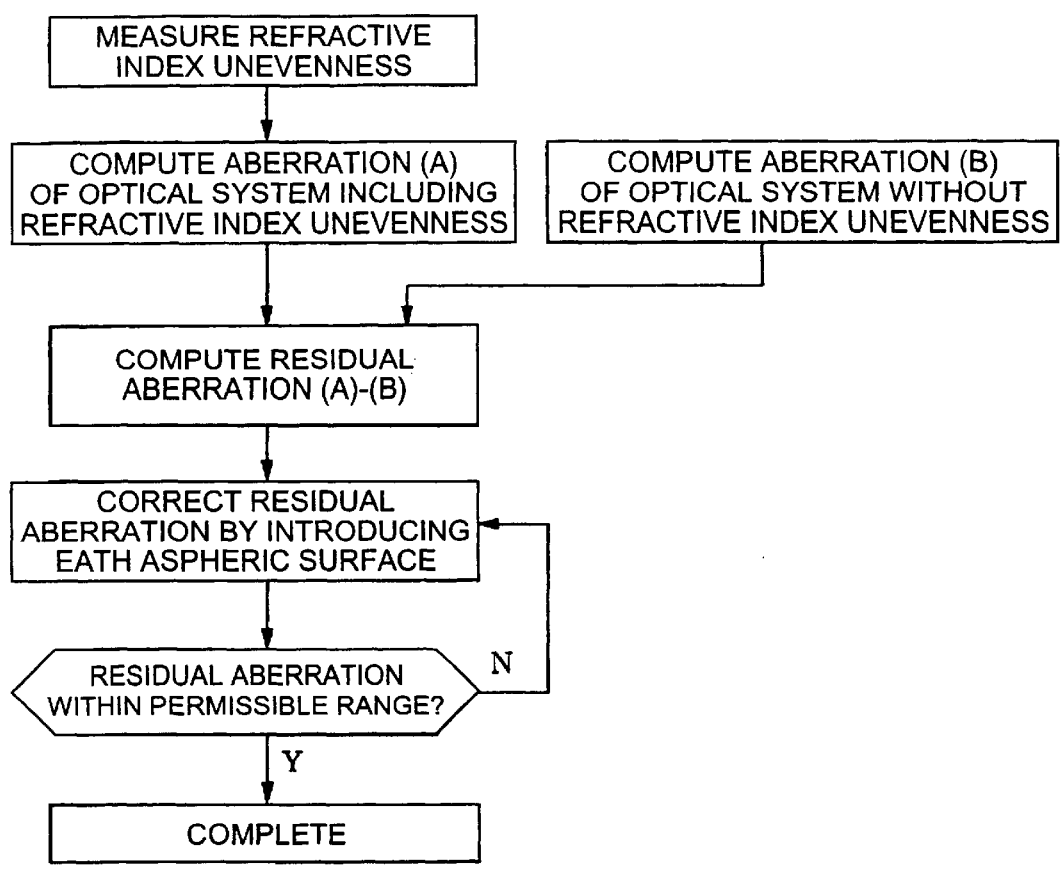
FIG. 2 shows a flowchart showing a technique of designing (or making) a projection optical system in accordance with the present invention.

(1)  $L_2$: $n_{max} - n_{min} = 0.002149$   $L_3$: $n_{max} - n_{min} = 0.00341$
     $L_5$: $n_{max} - n_{min} = 0.001259$   $L_9$: $n_{max} - n_{min} = 0.005237$
     $L_{10}$: $n_{max} - n_{min} = 0.003515$  $L_{15}$: $n_{max} - n_{min} = 0.000365$
     $L_{18}$: $n_{max} - n_{min} = 2.43 \times 10^{-5}$  $L_{19}$: $n_{max} - n_{min} = 0.000624$
     $L_{21}$: $n_{max} - n_{min} = 0.000469$  $L_{23}$: $n_{max} - n_{min} = 0.001227$
(2)  $|f_4/L| = 0.08$
(3)  $f_5/L = 0.12$
(4)  $f_6/L = 0.16$
(5)  $D_{56}/L = 0.03$
(6)  $D_6/R_6 = 0.98$
(7)  $|Df - Db| = 1.04$
(8)  $|Af - Ab| = 0.21$
(9)  $|Cf - Cb| = 0.64$
(10) $|Sf - Sb| = 0.19$ Next, FIG. 2 shows a technique of designing the above-mentioned projection optical system. First, the refractive index distribution of each of the lenses constituting the projection optical system is measured, so as to classify the individual lenses into those having a uniform refractive index and those having an uneven refractive index. As the criteria for evaluation, the above-mentioned expression (1) is used.

Subsequently, two kinds of aberration are computed. The first aberration is aberration (A) obtained when the measured refractive index is used as it is, whereas the second aberration is aberration (B) obtained when the refractive index of the lens having an uneven refractive index is replaced by a uniform value. The uniform value of refractive index to be used as the replacement is, for example, the value on the optical axis, i.e., $N_O$. Here, aberration (B) is the target value for correcting aberration (A) by introducing an aspheric surface. Namely, when correcting aberration (A) by introducing an aspheric surface in this embodiment, the aspheric surface is introduced so as to attain aberration (B), which might have been obtained if the refractive index distribution is uniform, but not to yield zero aberration.

Then, residual aberration (A)–(B) resulting from the in-homogeneousness in refractive index is determined. Thereafter, aberration (A') obtained upon introduction of an aspheric surface is determined, residual aberration (A')–(B) is determined, and this process is repeated until the residual aberration (A')–(B) falls within a permissible range. If the aberration (A')–(B) falls within a permissible range, i.e., "complete" state is attained, then the aspheric surface in the complete state is employed, and an aspherical lens is made in conformity to its aspheric surface data.

Figure 4A:
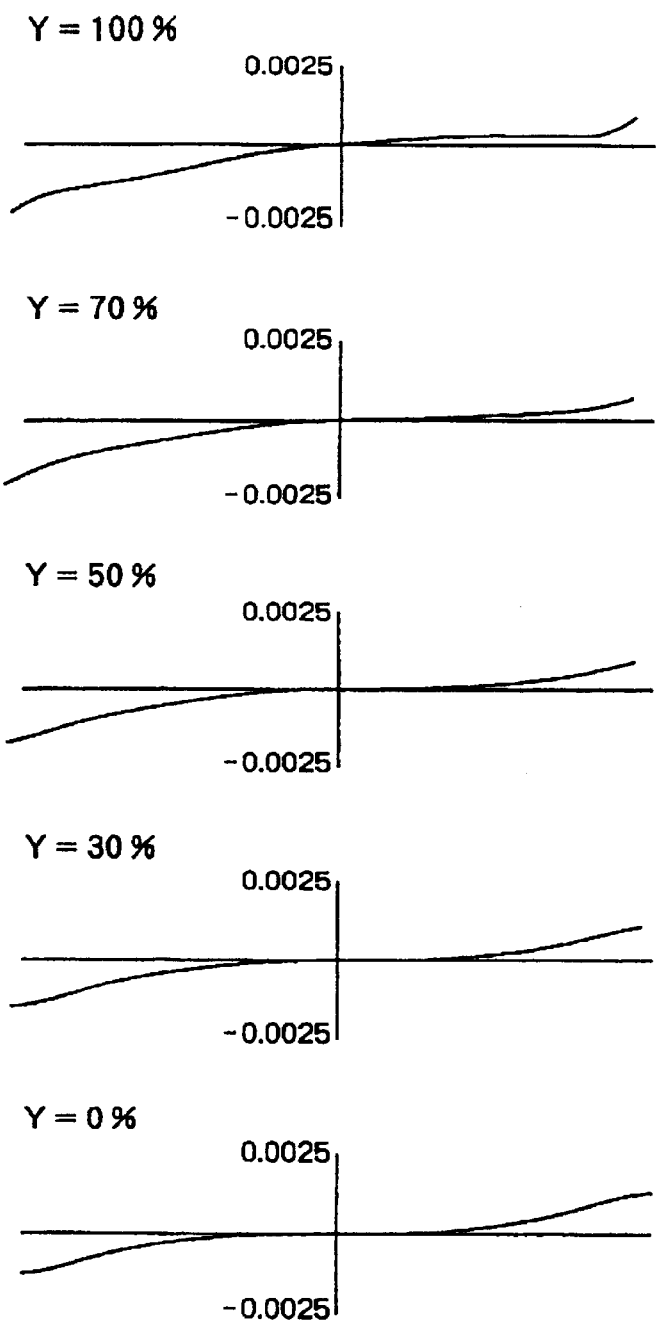
FIGS. 4A and 4B show charts showing lateral aberration in the case where lenses with in-homogeous refractive index are used without introducing aspheric surfaces.
Figure 4B:
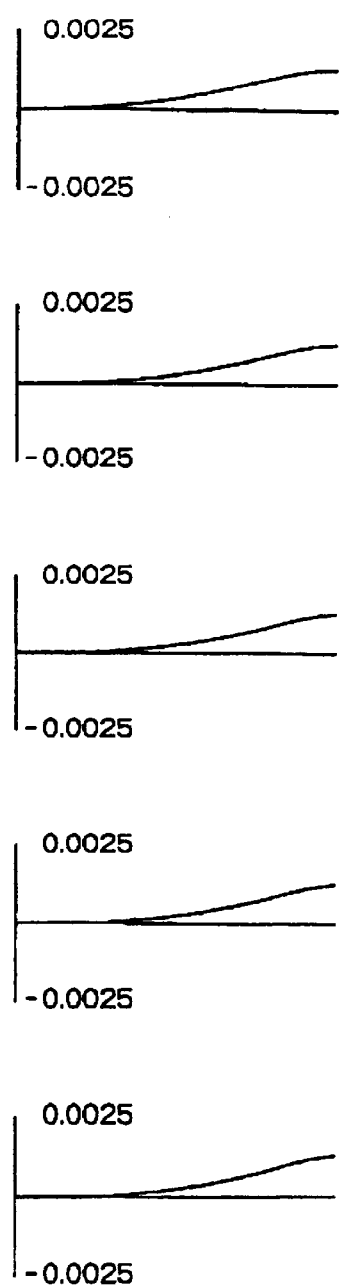
Figure 5:
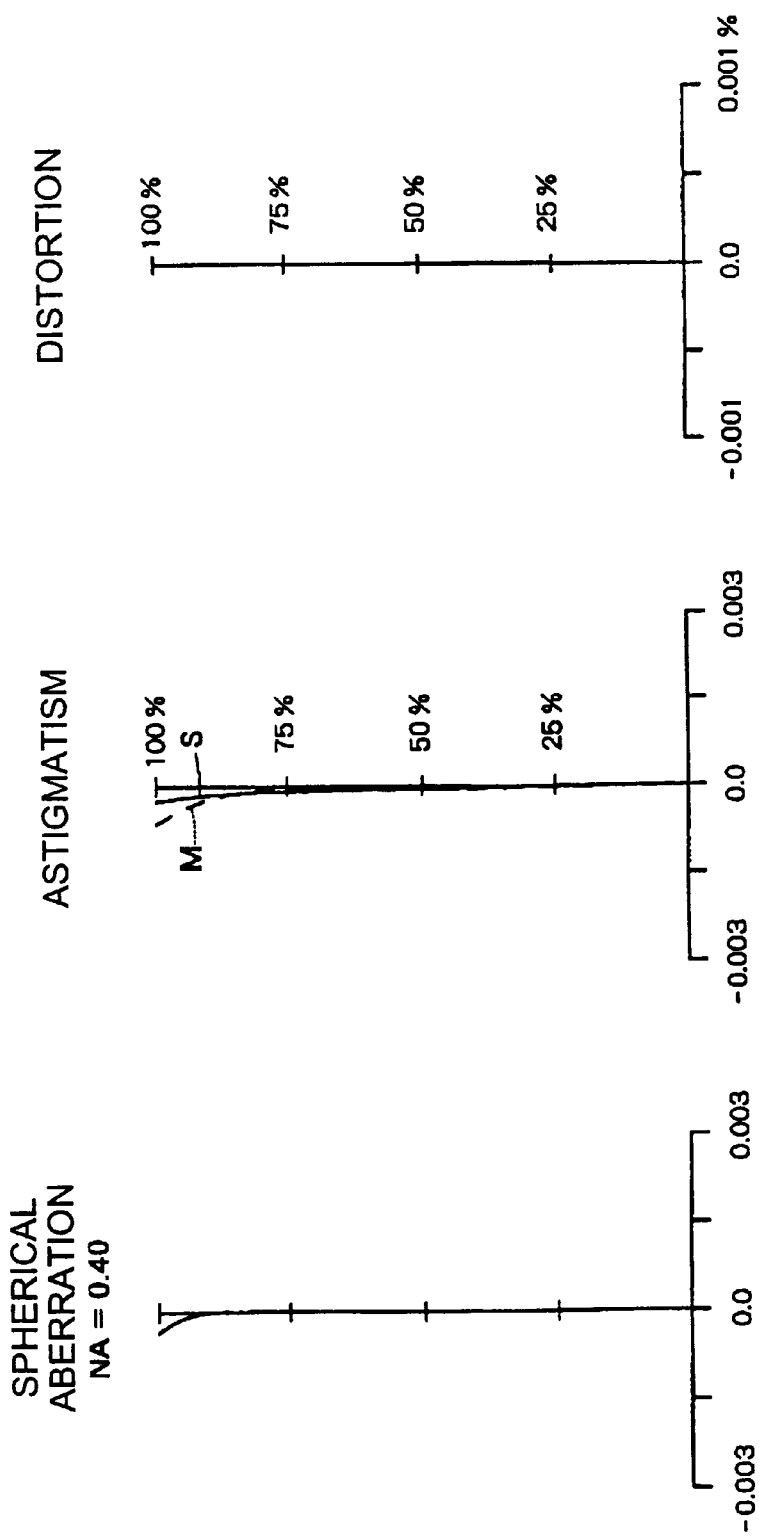
FIG. 5 shows a chart showing spherical aberration, astigmatism, and distortion in the case where lenses with in-homogeous refractive index are replaced by lenses with even refractive index.
Figure 7:
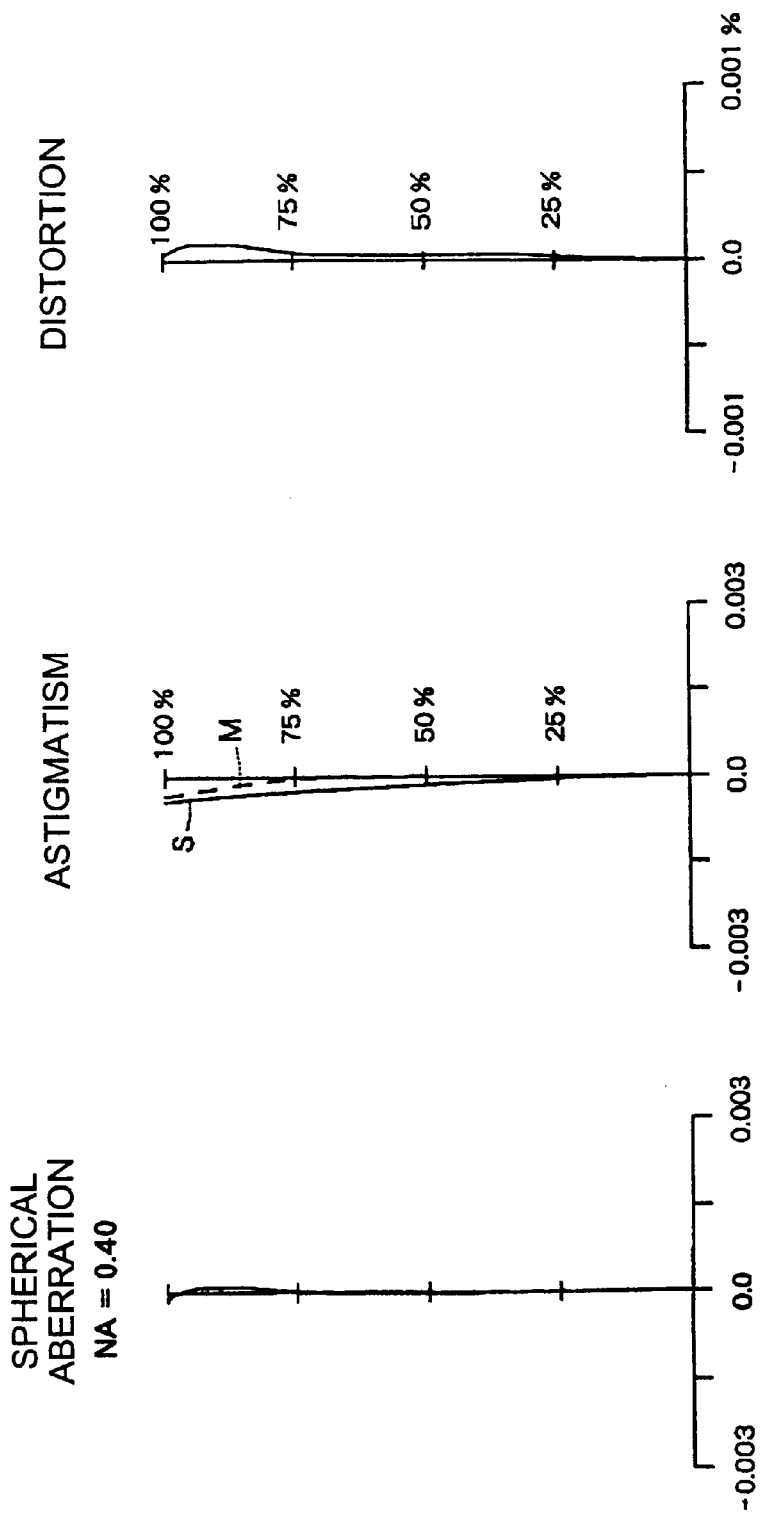
FIG. 7 shows a chart showing spherical aberration, astigmatism, and distortion in the case where lenses with in-homogeous refractive index are used while introducing aspheric surfaces.

FIG. 3 shows spherical aberration, astigmatism, and distortion in the case of (A) where the data of "Refractive Index In-homogeneousness" in Table 1 are used as they are, whereas FIG. 4 shows lateral aberration in the case of (A). In the lateral aberration chart, (a) indicates the aberration of a light beam within a meridional image plane, whereas (b) indicates the aberration of a light beam within a sagittal image plane. Similarly, FIGS. 5, 6A and 6B show various kinds of aberration in the case of (B) where the refractive index $N_O$ on the optical axis is uniformly employed without using the data of "Refractive Index In-homogeneousness" in Table 1. FIGS. 7, 8A and 8B show various kinds of aberration in the completed state where the aspheric surface is introduced.

As shown in these charts, while aberration is quite unfavorable in the case of (A), so that the projection optical system is hard to use, the aberration in the completed state is favorably corrected so as to be on a par with that in the case of (B).

The foregoing embodiment shows an example in which the in-homogeneousness in refractive index distribution of each dioptric optical member (lens or the like) constituting a projection optical system is measured, and at least one aspheric surface (correction surface) is formed in the projection optical system in order to correct the deterioration of its optical characteristics (imaging performance) occurring due to the in-homogeneousness in refractive index distribution of each dioptric optical member (lens or the like).

Next, with reference to FIGS. 9 and 10, respective embodiments concerning the method of making a projection optical system which take account of the in-homogeneousness in refractive index distribution of each dioptric optical member (lens or the like) constituting the projection optical system and the error in processed surface of each dioptric optical member (lens or the like) constituting the projection optical system will be explained.

Figure 9:
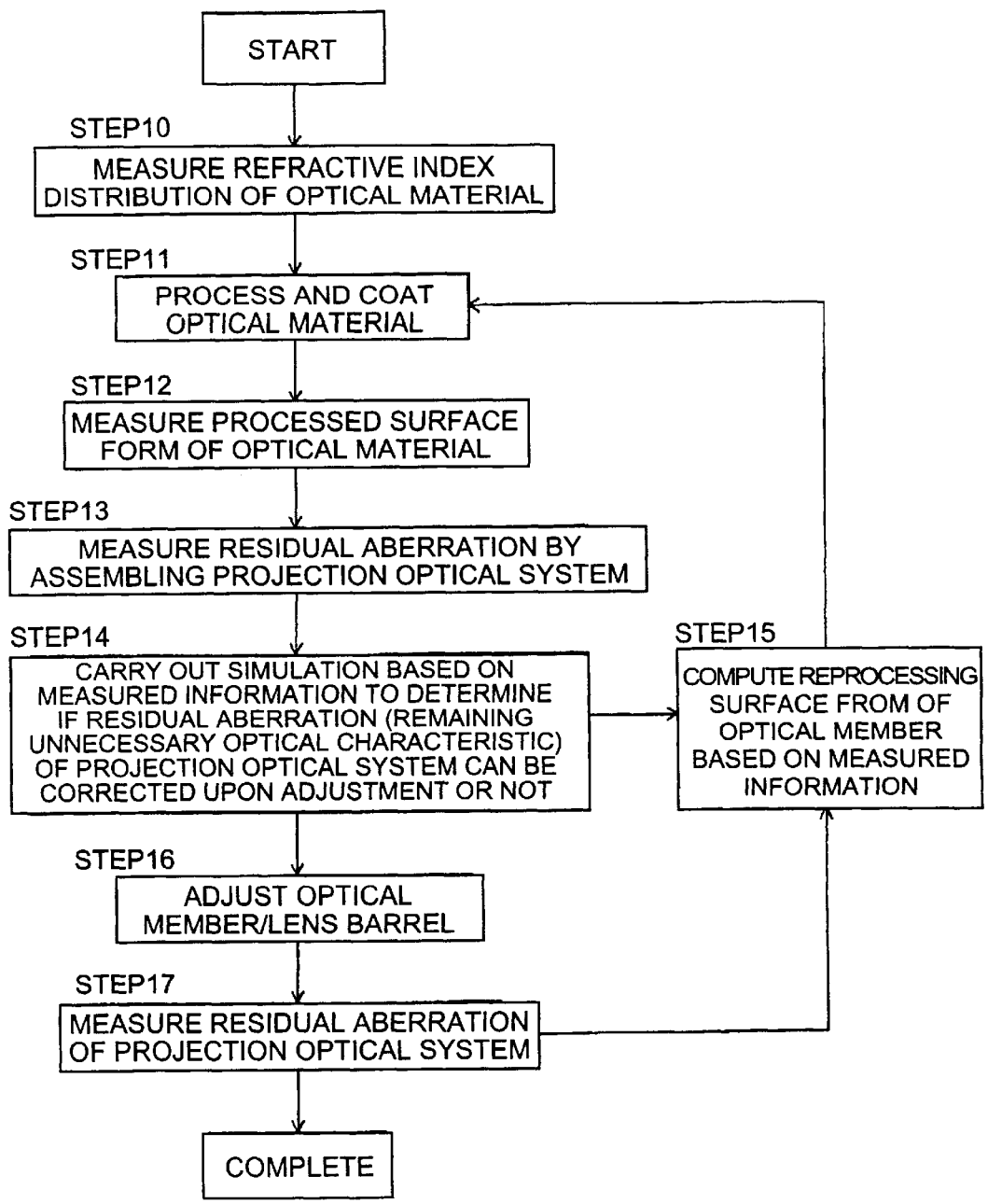
FIG. 9 shows a flowchart showing another technique of making a projection optical system in accordance with the present invention.

FIG. 9 shows the flow of the method of making a projection optical system in accordance with a second embodiment of the present invention. As shown in FIG. 9, in step 10, an interferometer for measuring the refractive index distribution is used for measuring the distribution of refractive index in an optical material (dioptric optical member) before processing. Then, the information concerning the distribution of refractive index in the optical material (dioptric optical member) before processing measured by the interferometer for measuring the refractive index distribution is stored into a memory section within a computer. Here, the optical material before processing is an optical glass block (so-called disk member) or the like with a predetermined thickness, before being processed into a lens, cut out from an ingot of optical glass for the lens or the like, or an ingot itself before cutting out the optical glass block.

If the refractive index distribution measuring step concerning the optical member (dioptric optical member) before processing is completed at the foregoing step 10, then the flow proceeds to step 11.

In step 11, a lens processing apparatus (optical member processing apparatus) and a lens polishing apparatus (optical member polishing apparatus) are used for processing and polishing a number of optical glass parts cut out from optical glass ingots for lens and the like, and the step of processing and polishing is repeated until thus processed and ground optical members (lens and the like) attain their optical design values and function as optical members constituting the projection optical system (until their manufacturing errors become permissible). If the refractive index distribution of ingot before cutting out optical glass blocks is measured at the foregoing step 10, then a number of optical glass parts are cut out from the optical glass ingot before the step of processing and polishing is carried out in step 11.

Next, the optical members having completed processing and polishing are successively coated with an antireflective film for enhancing their transmittance and the like by a thin-film deposition apparatus, whereby optical members for assembling the projection optical system are made. When step 11 is completed, then the flow proceeds to step 12.

In step 12, an interferometer for measuring the processed surface form of optical member is used for measuring the processed surface form of each optical member in order to obtain information about errors in processing concerning the processed surface of each optical member made in step 11. The information about the processed surface form of each optical member measured by the interferometer for measuring the processed surface form of optical member is stored into the memory section within the computer. If the measurement of processed surfaces concerning all the optical members constituting the projection optical system is completed, then step 12 is completed, and the flow proceeds to step 13. Though the processed surface form of optical member is measured in step 12 after the processed surface of optical member is coated with a predetermined thin film, the processed surface of optical member may be coated with a predetermined thin film after the processed surface form of optical member is measured.

In step 13, the projection optical system is assembled by use of the optical members each subjected to the foregoing steps 10 to 12, and the assembling information of projection optical system upon assembling the projection optical system (positional information (setting information) of the individual members including the relative intervals between the optical members, inclination of each optical member, eccentricity of each optical member (deviation in a direction orthogonal to the optical axis), relative intervals between lens barrels for holding the individual optical members, inclination of each lens barrel, eccentricity of each lens barrel (deviation in the direction orthogonal to the optical axis), and the like) is stored into the memory section within the computer.

After the projection optical system is assembled, the residual aberration (remaining unnecessary optical characteristics) in the measured projection optical system is measured. Then, thus measured information concerning the projection optical system (remaining unnecessary optical characteristics) is stored into the memory section within the computer. Here, the residual aberration of the projection optical system includes wavefront aberration, spherical aberration, astigmatism, curvature of field, coma, distortion, chromatic aberration, and the like. The unnecessary optical characteristics remaining in the projection optical system includes errors in magnification, telecentric errors (errors in inclination with respect to the optical axis of a principal ray), and the like in addition to the above-mentioned residual aberration.

Here, the residual aberration of projection optical system can be determined by measurement employing test exposure in which a test pattern for aberration measurement is exposed to a photosensitive substrate by use of a test reticle, or measurement using an interferometer. The above-mentioned test exposure comprises the steps of attaching the projection optical system assembled by step 13 to a testing apparatus for test exposure, and illuminating the test reticle installed at the object surface of projection optical system with an illumination system within the testing apparatus, thereby projecting and exposing a pattern image of the test reticle onto the photosensitive substrate installed at the image plane of the projection optical system. The residual aberration upon this test exposure can be determined by developing the exposed substrate and then analyzing the exposure pattern with a viewing apparatus such as electron microscope. After step 13 is completed, the flow proceeds to step 14.

In step 14, according to the individual items of information stored into the memory section within the computer, i.e., the information concerning the distribution of refractive index in optical members (dioptric optical members) before processing obtained in step 10, the information concerning the processed surface form of each optical member obtained in step 12, and the information concerning the residual aberration (remaining unnecessary optical characteristics) of the projection optical system obtained in step 13, a computer simulation (e.g., optical calculation by ray tracing or the like) is carried out. Depending on the result of computer simulation, it is determined whether or not the residual aberration (remaining unnecessary optical characteristics) of projection optical system measured in step 13 can be corrected by adjustment of the projection optical system (positional adjustment including the inclination, shift in the optical axis direction, and shift in a direction orthogonal to the optical axis concerning optical members, lens barrels, and the like). In other words, in step 14, whether or not the residual aberration (remaining unnecessary optical characteristics) of projection optical system measured in step 13 can be corrected by the adjustment of low-order aberration upon adjustment of the projection optical system, for example, is determined according to the computer simulation.

Preferably, the computer simulation in step 14 is carried out by use of not only the information concerning the distribution of refractive index in optical members (dioptric optical members) obtained in step 10, the information concerning the processed surface form of each optical member obtained in step 12, and the information concerning the residual aberration (remaining unnecessary optical characteristics) of projection optical system obtained in step 13, but also the optical design information of the projection optical system being made and the assembling information of projection optical system upon assembling the projection optical system (positional information (setting information) of the individual members including the relative intervals between the optical members, inclination of each optical member, eccentricity of each optical member (deviation in a direction orthogonal to the optical axis), relative intervals between lens barrels for holding the individual optical members, inclination of each lens barrel, eccentricity of each lens barrel (deviation in the direction orthogonal to the optical axis), and the like) in step 13.

If it is estimated in step 14 that the measured residual aberration (remaining unnecessary optical characteristics) cannot be corrected upon adjustment of the projection optical system, then the flow proceeds to step 15. In other words, if it is estimated that there exists higher-order aberration which cannot completely be corrected upon adjustment of the projection optical system, then the flow proceeds to step 15. In step 15, a correction surface form (spherical surface form, aspheric surface form of rotational symmetry, aspheric surface form of rotational asymmetry, or random aspheric surface form) concerning the processed surface (optical surface) of at least one optical member at an appropriate position capable of correcting the aberration component (unnecessary optical characteristics component) that cannot completely be corrected upon adjustment of the projection optical system is computed according to a computer simulation (e.g., optical calculation by ray tracing or the like). Preferably, the computer simulation in the step of computing the correction surface form in step 15 is carried out by use of not only the information concerning the distribution of refractive index in optical members (dioptric optical members) obtained in step 10, the information concerning the processed surface form of each optical member obtained in step 12, and the information concerning the residual aberration (remaining unnecessary optical characteristics) of projection optical system obtained in step 13, but also the optical design information of the projection optical system being made and the assembling information of projection optical system upon assembling the projection optical system (positional information (setting information) of the individual members including the relative intervals between the optical members, inclination of each optical member, eccentricity of each optical member (deviation in a direction orthogonal to the optical axis), relative intervals between lens barrels for holding the individual optical members, inclination of each lens barrel, eccentricity of each lens barrel (deviation in the direction orthogonal to the optical axis), and the like) in step 13.

Thereafter, the flow returns to step 11, where the projection optical system is temporarily disassembled, and optical members for reprocessing are taken out. Next, according to the information concerning the correction surface form computed in step 15, the lens processing apparatus (optical member processing apparatus) and lens polishing apparatus (optical member polishing apparatus) are used for processing and polishing the reprocessing surfaces (optical surfaces) of optical members for reprocessing, and coating the reprocessing surfaces of optical members for reprocessing; and then steps 12, 13, and 14 are repeated.

If it is estimated in step 14 that the measured residual aberration (remaining unnecessary optical characteristics) can be corrected upon adjustment of the projection optical system, then the flow proceeds to step 16, where the projection optical system is adjusted. The adjustment information (positional information (setting information) of the individual members including the relative intervals between the optical members, inclination of each optical member, eccentricity of each optical member (deviation in a direction orthogonal to the optical axis), relative intervals between lens barrels for holding the individual optical members, inclination of each lens barrel, eccentricity of each lens barrel (deviation in the direction orthogonal to the optical axis), and the like) when adjusting the projection optical system in step 16 is stored into the memory section within the computer.

Here, the adjustment of projection optical system in step 16 includes the positional adjustment (including the adjustment of the inclination, shift in the optical axis direction, and eccentricity) of a number of optical members and the positional adjustment (including the adjustment of the inclination, shift in the optical axis direction, and eccentricity) of a plurality of divided lens barrels when the projection optical system is constituted by the divided lens barrels. If the foregoing step 16 is completed, then the flow proceeds to step 17.

In step 17, an optical characteristics (imaging performance) of the projection optical system is measured in order to determine whether the residual aberration (remaining unnecessary optical characteristics) of the projection optical system is permissible or not. Here, as in step 13, the optical characteristics (imaging performance) of projection optical system can be determined by measurement employing test exposure or measurement using an interferometer.

If the residual aberration (remaining unnecessary optical characteristics) of the projection optical system is permissible, then the projection optical system is completed.

If the residual aberration (remaining unnecessary optical characteristics) of the projection optical system is not permissible, by contrast, then the information concerning the measured residual aberration (remaining unnecessary optical characteristics) of the projection optical system is stored into the memory section within the computer, and the flow proceeds to step 15 again.

In step 15, a correction surface form (spherical surface form, aspheric surface form of rotational symmetry, aspheric surface form of rotational asymmetry, or random aspheric surface form) concerning the processed surface (optical surface) of at least one optical member at an appropriate position capable of correcting the residual aberration (unnecessary optical characteristics component) of projection optical system determined in step 17 is computed. Preferably, the computer simulation in the step of computing the correction surface form in step 15 is carried out by use of not only the information concerning the distribution of refractive index in optical members (dioptric optical members) obtained in step 10, the information concerning the processed surface form of each optical member obtained in step 12, and the information concerning the residual aberration (remaining unnecessary optical characteristics) of projection optical system obtained in step 17, but also the optical design information of the projection optical system being made, the assembling information of projection optical system upon assembling the projection optical system (information such as relative intervals between the individual optical members, deviation and eccentricity of each optical member (deviation in a direction orthogonal to the optical axis), inclination of each optical member, and the like) in step 13, and the adjustment information of projection optical system (information about relative intervals between the individual optical members, and the like) upon adjusting the projection optical system in step 16.

Thereafter, steps 11 to 17 are repeated until the residual aberration (remaining unnecessary optical characteristics) of projection optical system becomes permissible. As a result, a projection optical system having an excellent optical performance (imaging performance) can be made eventually. Here, the reprocessing surfaces computed and processed in steps 15 and 11 by way of step 14 or 17 may be all the processed surfaces of a plurality of optical members constituting the projection optical system.

Next, with reference to FIG. 10, the method of making a projection optical system in accordance with another embodiment of the present invention will be explained. While the embodiment shown in FIG. 9 shows an example in which whether to reprocess a processed surface or not is determined by a computer simulation after the projection optical system is once assembled, the following embodiment shows an example in which a computer simulation estimates whether or not a processed surface is to be reprocessed to such an extent that the residual aberration can be corrected upon adjustment of the projection optical system before assembling the projection optical system.

Figure 10:
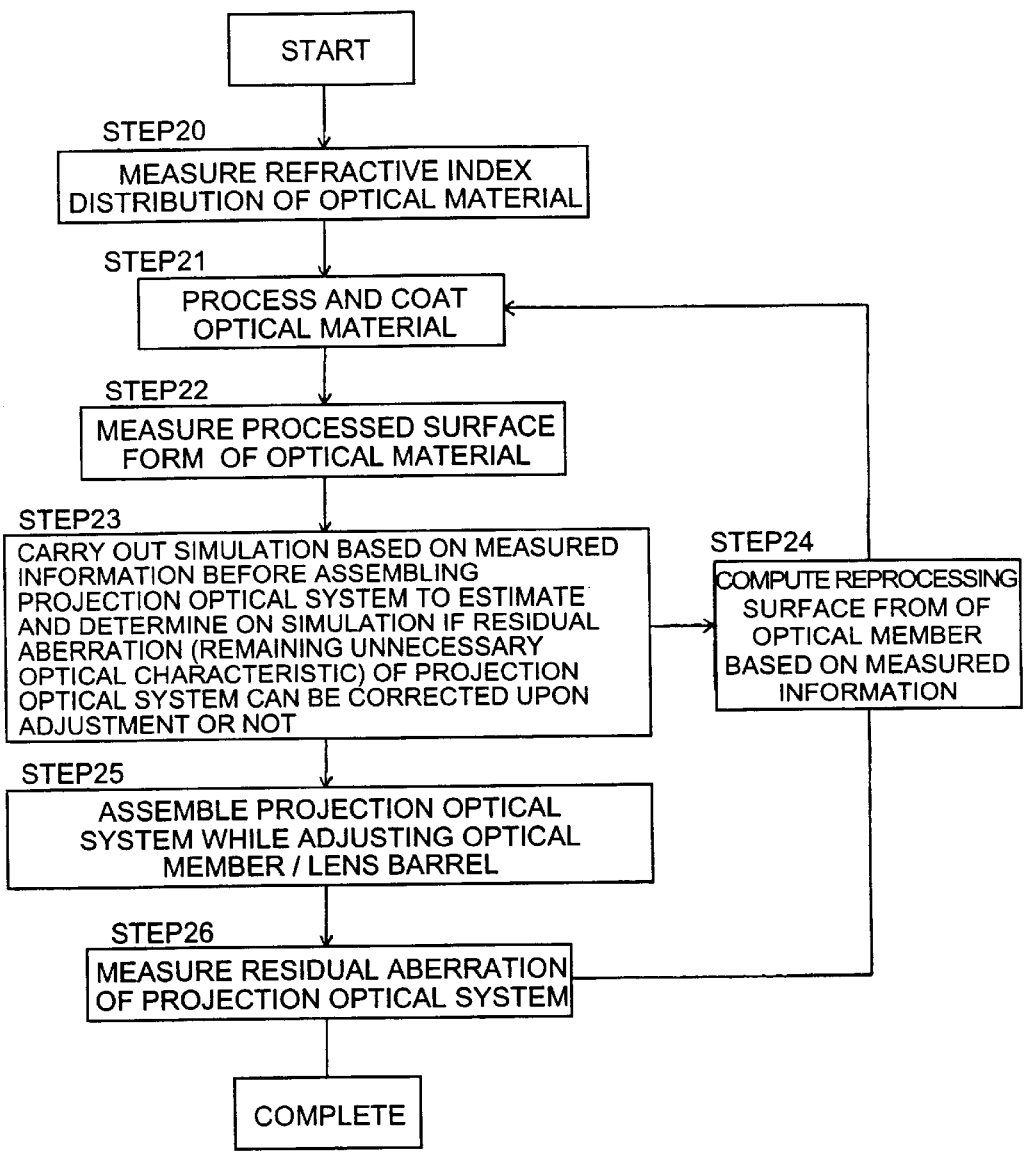
FIG. 10 shows a flowchart showing still another technique of making a projection optical system in accordance with the present invention.

FIG. 10 shows the flow of the method of making a projection optical system in accordance with a third embodiment of the present invention. As shown in FIG. 10, in step 20, an interferometer for measuring the refractive index distribution is used for measuring the distribution of refractive index in an optical material (dioptric optical member) before processing. Then, the information concerning the distribution of refractive index in the optical material (dioptric optical member) before processing measured by the interferometer for measuring the refractive index distribution is stored into a memory section within a computer. Here, the optical material before processing is an optical glass block (so-called disk member) or the like with a predetermined thickness, before being processed into a lens, cut out from an ingot of optical glass for the lens or the like, or an ingot itself before cutting out the optical glass block.

If the refractive index distribution measuring step concerning the optical member (dioptric optical member) before processing is completed at the foregoing step 20, then the flow proceeds to step 21.

In step 21, a lens processing apparatus (optical member processing apparatus) and a lens polishing apparatus (optical member polishing apparatus) are used for processing and polishing a number of optical glass parts cut out from optical glass ingots for lens and the like, and the step of processing and polishing is repeated until thus processed and ground optical members (lens and the like) attain their optical design values and function as optical members constituting the projection optical system (until their manufacturing errors become permissible). If the refractive index distribution of ingot before cutting out optical glass blocks is measured at the foregoing step 20, then a number of optical glass parts are cut out from the optical glass ingot before the step of processing and polishing is carried out in step 21.

Next, the optical members having completed processing and polishing are successively coated with an antireflective film for enhancing their transmittance and the like by a thin-film deposition apparatus, whereby optical members for assembling the projection optical system are made. When step 21 is completed, then the flow proceeds to step 22.

In step 22, an interferometer for measuring the processed surface form of optical member is used for measuring the processed surface form of each optical member in order to obtain information about errors in processing concerning the processed surface of each optical member made in step 21. The information about the processed surface form of each optical member measured by the interferometer for measuring the processed surface form of optical member is stored into the memory section within the computer. If the measurement of processed surfaces concerning all the optical members constituting the projection optical system is completed, then step 22 is completed, and the flow proceeds to step 23. Though the processed surface form of optical member is measured in step 22 after the processed surface of optical member is coated with a predetermined thin film, the processed surface of optical member may be coated with a predetermined thin film after the processed surface form of optical member is measured.

In step 23, according to the individual items of information stored into the memory section within the computer, i.e., the information concerning the distribution of refractive index in optical members (dioptric optical members) before processing obtained in step 20 and the information concerning the processed surface form of each optical member obtained in step 22, the residual aberration (remaining unnecessary optical characteristics) of projection optical system is estimated and calculated by a computer simulation (e.g., optical calculation by ray tracing or the like). Here, the residual aberration of the projection optical system includes wavefront aberration, spherical aberration, astigmatism, curvature of field, coma, distortion, chromatic aberration, and the like. The unnecessary optical characteristics remaining in the projection optical system includes errors in magnification, telecentric errors (errors in inclination with respect to the optical axis of a principal ray), and the like in addition to the above-mentioned residual aberration.

As a result of estimation and calculation by the computer, it is determined whether or not the estimated residual aberration (remaining unnecessary optical characteristics) of projection optical system can be corrected by adjustment of the projection optical system (positional adjustment including the inclination and shift of optical members, lens barrels, and the like) in step 25, which will be explained later. In other words, in step 23, whether or not the residual aberration (remaining unnecessary optical characteristics) computed in step 23 can be corrected by the adjustment of low-order aberration upon adjustment of the projection optical system, for example, is determined according to the computer simulation. The information concerning the residual aberration (remaining unnecessary optical characteristics) of projection optical system obtained in step 23 is stored into the memory section within the computer. Preferably, the computer simulation in step 23 is carried out by use of not only the information concerning the distribution of refractive index of optical materials (dioptric optical members) in step 20 and the information concerning the processed surface form of each optical member in step 22, but also the optical design information of the projection optical system currently being made.

If it is estimated in step 23 that the measured residual aberration (remaining unnecessary optical characteristics) cannot be corrected upon adjustment of the projection optical system, then the flow proceeds to step 24. In other words, if it is estimated that there exists higher-order aberration which cannot completely be corrected upon adjustment of the projection optical system, then the flow proceeds to step 24.

In step 24, a correction surface form (spherical surface form, aspheric surface form of rotational symmetry, aspheric surface form of rotational asymmetry, or random aspheric surface form) concerning the processed surface (optical surface) of at least one optical member at an appropriate position capable of correcting the aberration component (unnecessary optical characteristics component) that cannot completely be corrected upon adjustment of the projection optical system is computed according to a computer simulation (e.g., optical calculation by ray tracing or the like). Preferably, the computer simulation in the step of computing the correction surface form in step 24 is carried out by use of not only the information concerning the distribution of refractive index in optical members (dioptric optical members) obtained in step 20 and the information concerning the processed surface form of each optical member obtained in step 22, but also the optical design information of the projection optical system currently being made.

Thereafter, the flow returns to step 21, where the lens processing apparatus (optical member processing apparatus) and lens polishing apparatus (optical member polishing apparatus) are used, according to the information concerning the correction surface form computed in step 24, for processing and polishing the reprocessing surfaces (optical surfaces) of optical members for reprocessing, and coating is carried out for the reprocessing surfaces of optical members for reprocessing; and then steps 22 and 23 are repeated.

If it is estimated in step 23 that the measured residual aberration (remaining unnecessary optical characteristics) can be corrected upon adjustment of the projection optical system, then the flow proceeds to step 25.

In step 25, the optical members subjected to the foregoing step 23 are used for assembling and adjusting the projection optical system, so as to assemble the projection optical system. Here, the adjustment of projection optical system includes the positional adjustment (including the adjustment of the inclination, shift in the optical axis direction, and eccentricity) of a number of optical members and the positional adjustment (including the adjustment of the inclination, shift in the optical axis direction, and eccentricity) of a plurality of divided lens barrels when the projection optical system is constituted by the divided lens barrels.

The foregoing assembling information of projection optical system upon assembling the projection optical system (e.g., positional information (setting information) of relative intervals between individual optical members and relative intervals between lens barrels for holding the individual optical members) is stored into the memory section within the computer. If step 25 is completed, the flow proceeds to step 26.

In step 26, an optical characteristics (imaging performance) of the projection optical system is measured in order to determine whether the residual aberration (remaining unnecessary optical characteristics) of the projection optical system is permissible or not. Here, as in steps 13 and 17 in the example of FIG. 9, the optical characteristics (imaging performance) of projection optical system can be determined by measurement employing test exposure or measurement using an interferometer.

If the residual aberration (remaining unnecessary optical characteristics) of the projection optical system is permissible, then the projection optical system is completed. If the residual aberration (remaining unnecessary optical characteristics) of the projection optical system is not permissible, by contrast, then the measured information concerning the residual aberration (remaining unnecessary optical characteristics) of the projection optical system is stored into the memory section within the computer, and the flow proceeds to step 24. Subsequently, a correction surface form (spherical surface form, aspheric surface form of rotational symmetry, aspheric surface form of rotational asymmetry, or random aspheric surface form) concerning the processed surface (optical surface) of at least one optical member at an appropriate position capable of correcting the residual aberration component (unnecessary optical characteristics component) of projection optical system determined in step 26 is computed. Preferably, the computer simulation in the step of computing the correction surface form in step 24 is carried out by use of not only the information concerning the distribution of refractive index in optical members (dioptric optical members) obtained in step 20, the information concerning the processed surface form of each optical member obtained in step 21, and the information concerning the residual aberration (remaining unnecessary optical characteristics) of projection optical system obtained in step 26, but also the optical design information of the projection optical system being made and the assembling information of projection optical system upon assembling the projection optical system (positional information (setting information) of the individual members including the relative intervals between the optical members, inclination of each optical member, eccentricity of each optical member (deviation in a direction orthogonal to the optical axis), relative intervals between lens barrels for holding the individual optical members, inclination of each lens barrel, eccentricity of each lens barrel (deviation in the direction orthogonal to the optical axis), and the like) in step 25.

Thereafter, steps 21 to 26 are repeated until the residual aberration (remaining unnecessary optical characteristics) of projection optical system becomes permissible. As a result, a projection optical system having an excellent optical performance (imaging performance) can be made eventually. Here, the reprocessing surfaces computed and processed in steps 24 and 21 by way of step 23 or 26 may be all the processed surfaces of a plurality of optical members constituting the projection optical system.

For correcting the assembling errors and adjustment errors concerning the projection optical system, processing errors concerning the processed surfaces of optical members constituting the projection optical system, or all the errors in manufacture of errors in distribution of refractive index in optical members constituting the projection optical system, a correction member (correction plate having no refracting power, or the like) may be disposed between the object surface (reticle surface) of the projection optical system and the image plane (wafer surface or substrate surface) of the projection optical system in the examples shown in FIGS. 9 and 10. In this case, for correcting the residual aberration/residual errors measured in step 17 shown in FIG. 9 and step 24 shown in FIG. 10, the processing form of the surface of the correction member to be processed is preferably computed before the surface of correction member is processed in step 11 shown in FIG. 9 and step 21 shown in FIG. 10. The method of making a projection optical system by use of a correction member is disclosed in Japanese Patent Application Laid-Open No. HEI 8-203805, Japanese Patent Application Laid-Open No. HEI 11-45842, and the like.

While the methods of making a projection optical system in accordance with the present invention are explained in the foregoing with reference to FIGS. 2, 9, and 10, methods of making an exposure apparatus will now be explained with reference to FIGS. 11 to 14.

Figure 11:
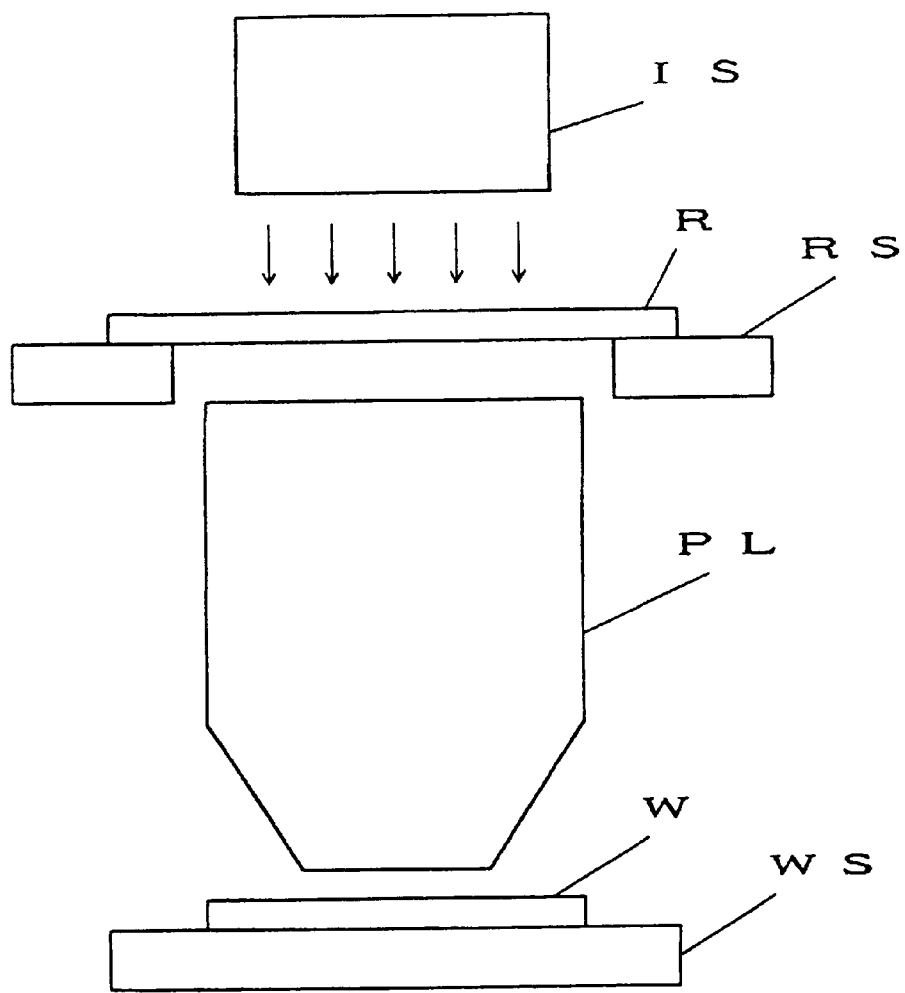
FIG. 11 is a view showing the configuration of an exposure apparatus made by the present invention.
Figure 12:
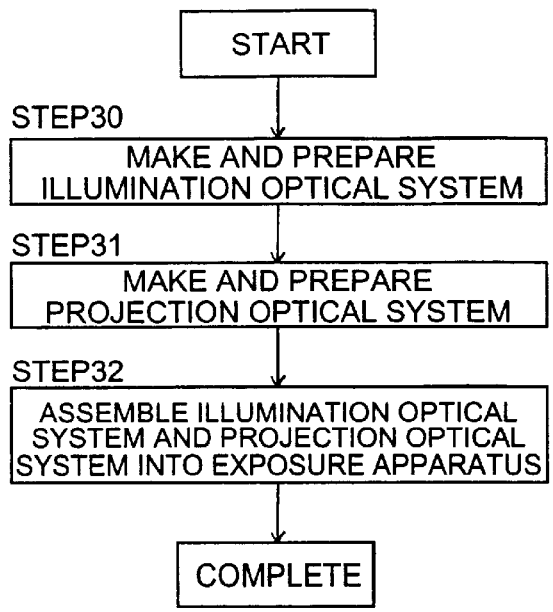
FIG. 12 shows a flowchart showing a technique of making an exposure apparatus in accordance with the present invention.

FIG. 11 shows the configuration of an exposure apparatus made by the present invention, whereas FIG. 12 shows the flow of method of making an exposure apparatus in accordance with another embodiment of the present invention for making the exposure apparatus shown in FIG. 11.

First, as shown in FIGS. 11 and 12, an illumination optical system IS for illuminating a reticle R formed with a predetermined pattern is made in step 30, and is prepared so as to be incorporated in the body of an exposure apparatus. The method of manufacture concerning the illumination optical system IS in step 30 will be explained later.

In step 31, on the other hand, as shown in FIGS. 11 and 12, a projection optical system PL is manufactured by the method according to FIGS. 2, 9, and 10 mentioned above independently of or in parallel with the above-mentioned step 30, and is prepared so as to be incorporated in the body of an exposure apparatus.

Next, in step 32, the illumination optical system IS prepared in step 30 and the projection optical system PL prepared in step 31 are assembled into the body of exposure apparatus. Namely, the illumination optical system IS prepared in step 30 and the projection optical system PL prepared in step 31 are assembled into the body of exposure apparatus at their predetermined positions such that a reticle (projection original) R is illuminated by the illumination optical system IS, whereas an image of a predetermined pattern formed on the reticle R is projected onto a wafer (photosensitive substrate) W by the projection optical system PL. As a consequence, an exposure apparatus having favorable performances can be made.

In step 32, the illumination optical system IS prepared in step 30 and the projection optical system PL prepared in step 31 are each attached to a support table (support member) not depicted in FIG. 11. A reticle stage RS for mounting the reticle R and a wafer stage (substrate stage) RS for mounting the wafer (photosensitive substrate) W are each attached to a support table (support member) not depicted in FIG. 11. Though not depicted in FIG. 12, the individual members are prepared by the respective steps for preparing them (a step of preparing the reticle stage RS for mounting the reticle R; a step of preparing the substrate stage WS for mounting the photosensitive substrate W; and a step of preparing respective support tables (support members) for holding the illumination optical system Is, projection optical system PL, reticle stage RS, and substrate stage WS at their predetermined positions).

Figure 13:
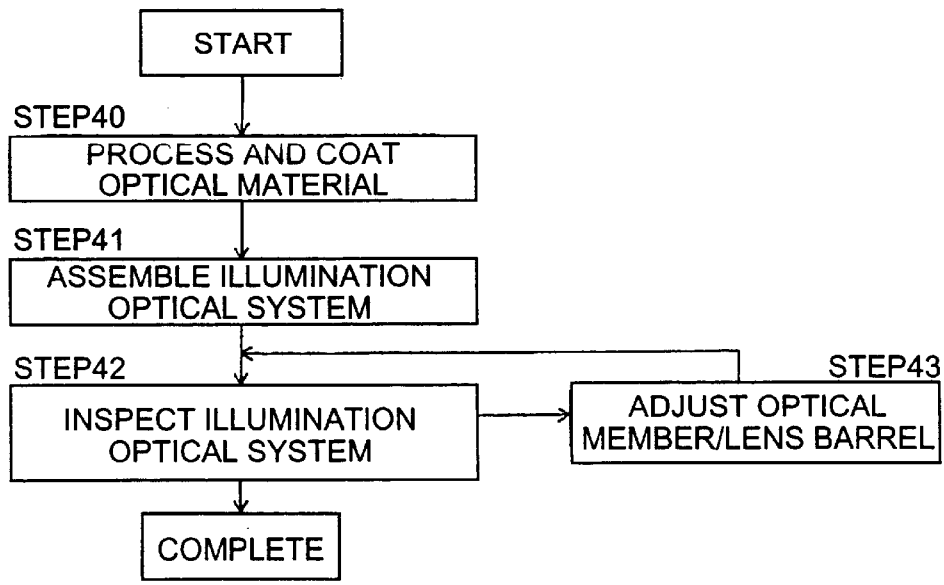
FIG. 13 shows a flowchart showing a technique of making an illumination optical system.

With reference to FIG. 13, a method of making the illumination optical system IS in step 30 shown in FIG. 12 will now be explained.

First, instep 40, as shown in FIG. 13, a lens processing apparatus (optical member processing apparatus) and a lens polishing apparatus (optical member polishing apparatus) are used for processing and polishing a number of optical glass parts (disk members) cut out from an optical glass ingot for lens and the like, and the step of processing and polishing is repeated until thus processed and ground optical members (lens and the like) conform to their optical design values and function as optical members constituting the illumination optical system IS (until their manufacturing errors become permissible).

Next, the optical members having completed processing and polishing are successively coated with an antireflective film for enhancing their transmittance and the like by a thin-film deposition apparatus, whereby optical members for assembling the illumination optical system IS are made. When step 40 is completed, then the flow proceeds to step 41.

In step 41, the optical members made by the foregoing step 40 are used for assembling the illumination optical system IS. If step 41 is completed, the flow proceeds to step 42.

In step 42, for measuring the evenness in illuminance of the illumination optical system IS in the surface to be irradiated (reticle surface) and the telecentricity for telecentric illumination, whether a desirable illumination characteristic is satisfied or not is inspected by use of an illuminance measuring apparatus or telecentricity measuring apparatus. If the illumination characteristic of the assembled illumination optical system IS is sufficient, then the illumination optical system IS is completed. If the illumination characteristic of the assembled illumination optical system IS is insufficient, by contrast, then the flow proceeds to step 43.

In step 43, the illumination optical system IS is adjusted. Here, positional adjustment such as adjustment of relative intervals between the individual optical members constituting the illumination optical system IS, adjustment of inclination of each optical member, adjustment of eccentricity of each optical member (its deviation in a direction orthogonal to the optical axis), adjustment of relative intervals between respective lens barrels for holding the optical members, inclination of each lens barrel, and eccentricity of each lens barrel (its deviation in a direction orthogonal to the optical axis) are carried out. The adjusting step for the illumination optical system IS in step 43 and the inspecting step for the illumination optical system IS in step 42 are repeated until the illumination optical system IS is adjusted such that the desirable illumination characteristic is obtained. As a consequence, the illumination optical system IS having a favorable illumination characteristic can be made.

Meanwhile, the above-mentioned manufacturing techniques in accordance with the present invention shown in FIGS. 2, 9, and 10 are applicable not only to the making of the projection optical system PL but also to the illumination optical system IS. As a consequence, the illumination optical system IS having high performances can be realized.

Hence, with reference to FIG. 14, an example in which them, technique shown in FIG. 9 is applied to the method of making the illumination optical system IS will be explained.

Figure 14:
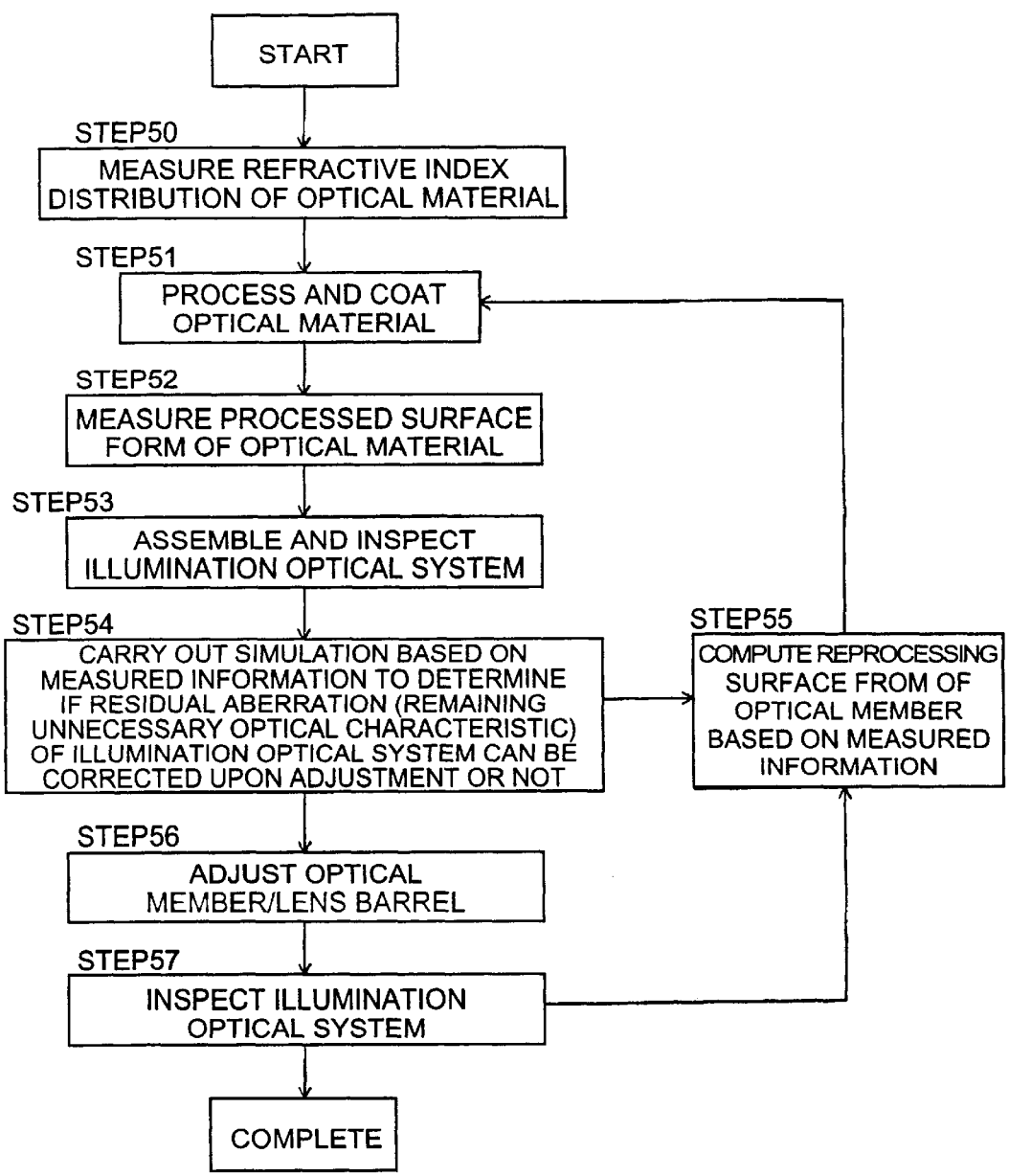
FIG. 14 shows a flowchart showing another technique of making an illumination optical system.

FIG. 14 shows the flow of another example in accordance with the method of making the illumination optical system IS in accordance with the present invention. First, in step 50, as shown in FIG. 14, an interferometer for measuring the refractive index distribution is used for measuring the distribution of refractive index in an optical material (dioptric optical member) before processing. Then, the information concerning the distribution of refractive index in the optical material (dioptric optical member) before processing measured by the interferometer for measuring the refractive index distribution is stored into a memory section within a computer. Here, the optical material before processing is an optical glass block (so-called disk member) or the like with a predetermined thickness, before being processed into a lens, cut out from an ingot of optical glass for the lens or the like, or an ingot itself before cutting out the optical glass block.

If the refractive index distribution measuring step concerning the optical member (dioptric optical member) before processing is completed at the foregoing step 50, then the flow proceeds to step 51.

In step 51, a lens processing apparatus (optical member processing apparatus) and a lens polishing apparatus (optical member polishing apparatus) are used for processing and polishing a number of optical glass parts cut out from optical glass ingots for lens and the like, and the step of processing and polishing is repeated until thus processed and ground optical members (lens and the like) attain their optical design values and function as optical members constituting the projection optical system (until their manufacturing errors become permissible). If the refractive index distribution of ingot before cutting out optical glass blocks is measured at the foregoing step 50, then a number of optical glass parts are cut out from the optical glass ingot before the step of processing and polishing is carried out in step 51.

Next, the optical members having completed processing and polishing are successively coated with an antireflective film for enhancing their transmittance and the like by a thin-film deposition apparatus, whereby optical members for assembling the projection optical system are made. When step 51 is completed, then the flow proceeds to step 52.

In step 52, an interferometer for measuring the processed surface form of optical member is used for measuring the processed surface form of each optical member in order to obtain information about errors in processing concerning the processed surface of each optical member made in step 51. The information about the processed surface form of each optical member measured by the interferometer for measuring the processed surface form of optical member is stored into the memory section within the computer. If the measurement of processed surfaces concerning all the optical members constituting the projection optical system is completed, then step 52 is completed, and the flow proceeds to step 53. Though the processed surface form of optical member is measured in step 52 after the processed surface of optical member is coated with a predetermined thin film, the processed surface of optical member may be coated with a predetermined thin film after the processed surface form of optical member is measured.

In step 53, the illumination optical system IS is assembled by use of the optical members each subjected to the foregoing steps 50 to 52, and the assembling information of illumination optical system IS upon assembling the illumination optical system IS (positional information (setting information) of the individual members including the relative intervals between the optical members, inclination of each optical member, eccentricity of each optical member (deviation in a direction orthogonal to the optical axis), relative intervals between lens barrels for holding the individual optical members, inclination of each lens barrel, eccentricity of each lens barrel (deviation in the direction orthogonal to the optical axis), and the like) is stored into the memory section within the computer.

After the illumination optical system IS is assembled, an illumination characteristic of the illumination optical system IS, i.e., the residual aberration (remaining unnecessary optical characteristics) in the illumination optical system, is measured. Then, thus measured information concerning the illumination optical system IS (remaining unnecessary optical characteristics) is stored into the memory section within the computer. Here, the residual aberration of the illumination optical system IS includes wavefront aberration, spherical aberration, astigmatism, curvature of field, coma, distortion, chromatic aberration, and the like. The unnecessary optical characteristics remaining in the illumination optical system IS includes errors in magnification, telecentric errors (errors in inclination with respect to the optical axis of a principal ray), in-homonegess in illuminance, and the like in addition to the above-mentioned residual aberration.

Here, the unnecessary optical characteristics of the illumination optical system IS can be determined by measurement using an illuminance measuring apparatus, telecentricity measuring apparatus, interferometer, and the like. After step 53 is completed, the flow proceeds to step 54.

In step 54, according to the individual items of information stored into the memory section within the computer, i.e., the information concerning the distribution of refractive index in optical members (dioptric optical members) before processing obtained in step 50, the information concerning the processed surface form of each optical member obtained in step 52, and the information concerning the residual aberration (remaining unnecessary optical characteristics) of illumination optical system IS obtained in step 53, a computer simulation (e.g., optical calculation by ray tracing or the like) is carried out. Depending on the result of computer simulation, it is determined whether or not the residual aberration (remaining unnecessary optical characteristics) of projection optical system measured in step 53 can be corrected by adjustment of the illumination optical system IS (positional adjustment including the inclination, shift in the optical axis direction, and shift in a direction orthogonal to the optical axis concerning optical members, lens barrels, and the like). In other words, in step 54, whether or not the residual aberration (remaining unnecessary optical characteristics) of illumination optical system measured in step 53 can be corrected by the adjustment of low-order aberration upon adjustment of the illumination optical system IS, for example, is determined according to the computer simulation.

Preferably, the computer simulation in step 54 is carried out by use of not only the information concerning the distribution of refractive index in optical members (dioptric optical members) obtained in step 50, the information concerning the processed surface form of each optical member obtained in step 52, and the information concerning the residual aberration (remaining unnecessary optical characteristics) of illumination optical system IS obtained in step 53, but also the optical design information of the illumination optical system IS being made and the assembling information of illumination optical system IS upon assembling the illumination optical system IS (positional information (setting information) of the individual members including the relative intervals between the optical members, inclination of each optical member, eccentricity of each optical member (deviation in a direction orthogonal to the optical axis), relative intervals between lens barrels for holding the individual optical members, inclination of each lens barrel, eccentricity of each lens barrel (deviation in the direction orthogonal to the optical axis), and the like) in step 53.

If it is estimated in step 54 that the measured residual aberration (remaining unnecessary optical characteristics) cannot be corrected upon adjustment of the illumination optical system IS, then the flow proceeds to step 55. In other words, if it is estimated that there exists higher-order aberration which cannot completely be corrected upon adjustment of the illumination optical system IS, then the flow proceeds to step 55. In step 55, a correction surface form (spherical surface form, aspheric surface form of rotational symmetry, aspheric surface form of rotational asymmetry, or random aspheric surface form) concerning the processed surface (optical surface) of at least one optical member at an appropriate position capable of correcting the aberration component (unnecessary optical characteristics component) that cannot completely be corrected upon adjustment of the illumination optical system IS is computed according to a computer simulation (e.g., optical calculation by ray tracing or the like). Preferably, the computer simulation in the step of computing the correction surface form in step 55 is carried out by use of not only the information concerning the distribution of refractive index in optical members (dioptric optical members) obtained in step 50, the information concerning the processed surface form of each optical member obtained in step 52, and the information concerning the residual aberration (remaining unnecessary optical characteristics) of illumination optical system IS obtained in step 53, but also the optical design information of the illumination optical system IS being made and the assembling information of illumination optical system IS upon assembling the illumination optical system IS (positional information (setting information) of the individual members including the relative intervals between the optical members, inclination of each optical member, eccentricity of each optical member (deviation in a direction orthogonal to the optical axis), relative intervals between lens barrels for holding the individual optical members, inclination of each lens barrel, eccentricity of each lens barrel (deviation in the direction orthogonal to the optical axis), and the like) in step 53.

Thereafter, the flow returns to step 51, where at least a part of the illumination optical system IS is temporarily disassembled, and optical members for reprocessing are taken out. Next, according to the information concerning the correction surface form computed in step 55, the lens processing apparatus (optical member processing apparatus) and lens polishing apparatus (optical member polishing apparatus) are used for processing and polishing the reprocessing surfaces (optical surfaces) of optical members for reprocessing, and coating is carried out for the reprocessing surfaces of optical members for reprocessing; and then steps 52, 53, and 54 are repeated.

If it is estimated instep 54 that the measured residual aberration (remaining unnecessary optical characteristics) can be corrected upon adjustment of the illumination optical system IS, then the flow proceeds to step 56, where the illumination optical system IS is adjusted. The adjustment information of illumination optical system IS (positional information (setting information) of the individual members including the relative intervals between the optical members, inclination of each optical member, eccentricity of each optical member (deviation in a direction orthogonal to the optical axis), relative intervals between lens barrels for holding the individual optical members, inclination of each lens barrel, eccentricity of each lens barrel (deviation in the direction orthogonal to the optical axis), and the like) when adjusting the illumination optical system IS in step 56 is stored into the memory section within the computer.

Here, the adjustment of illumination optical system IS in step 56 includes the positional adjustment (including the adjustment of the inclination, shift in the optical axis direction, and eccentricity) of a number of optical members and the positional adjustment (including the adjustment of the inclination, shift in the optical axis direction, and eccentricity) of a plurality of divided lens barrels when the illumination optical system IS is constituted by the divided lens barrels. If the foregoing step 56 is completed, then the flow proceeds to step 57.

In step 57, an optical characteristics (imaging performance) of the illumination optical system IS is measured in order to determine whether the residual aberration (remaining unnecessary optical characteristics) of the illumination optical system IS is permissible or not. Here, the optical characteristics (imaging performance) of illumination optical system IS can be determined by a measurement technique similar to that in step 53.

If the residual aberration (remaining unnecessary optical characteristics) of the illumination optical system IS is permissible, then the illumination optical system IS is completed.

If the residual aberration (remaining unnecessary optical characteristics) of the illumination optical system IS is not permissible, by contrast, then the information concerning the measured residual aberration (remaining unnecessary optical characteristics) of illumination optical system IS is stored into the memory section within the computer, and the flow proceeds to step 55 again.

In step 55, a correction surface form (spherical surface form, aspheric surface form of rotational symmetry, aspheric surface form of rotational asymmetry, or random aspheric surface form) concerning the processed surface (optical surface) of at least one optical member at an appropriate position capable of correcting the residual aberration (unnecessary optical characteristics component) of illumination optical system IS determined in step 57 is computed. Preferably, the computer simulation in the step of computing the correction surface form in step 55 is carried out by use of not only the information concerning the distribution of refractive index in optical members (dioptric optical members) obtained in step 50, the information concerning the processed surface form of each optical member obtained in step 52, and the information concerning the residual aberration (remaining unnecessary optical characteristics) of illumination optical system IS obtained instep 57, but also the optical design information of the illumination optical system IS being made, the assembling information of illumination optical system IS upon assembling the illumination optical system IS (information such as relative intervals between the individual optical members, deviation and eccentricity of each optical member (deviation in a direction orthogonal to the optical axis), and inclination of each optical member) in step 53, and the adjustment information of illumination optical system IS (information about relative intervals between the individual optical members, and the like) upon adjusting the illumination optical system IS in step 56.

Thereafter, steps 51 to 57 are repeated until the residual aberration (remaining unnecessary optical characteristics) of illumination optical system IS becomes permissible. As a result, the illumination optical system IS having an excellent optical performance (imaging performance) can be made eventually. Here, the reprocessing surfaces computed and processed in steps 55 and 51 by way of step 54 or 57 may be all the processed surfaces of a plurality of optical members constituting the illumination optical system IS.

Figure 15:
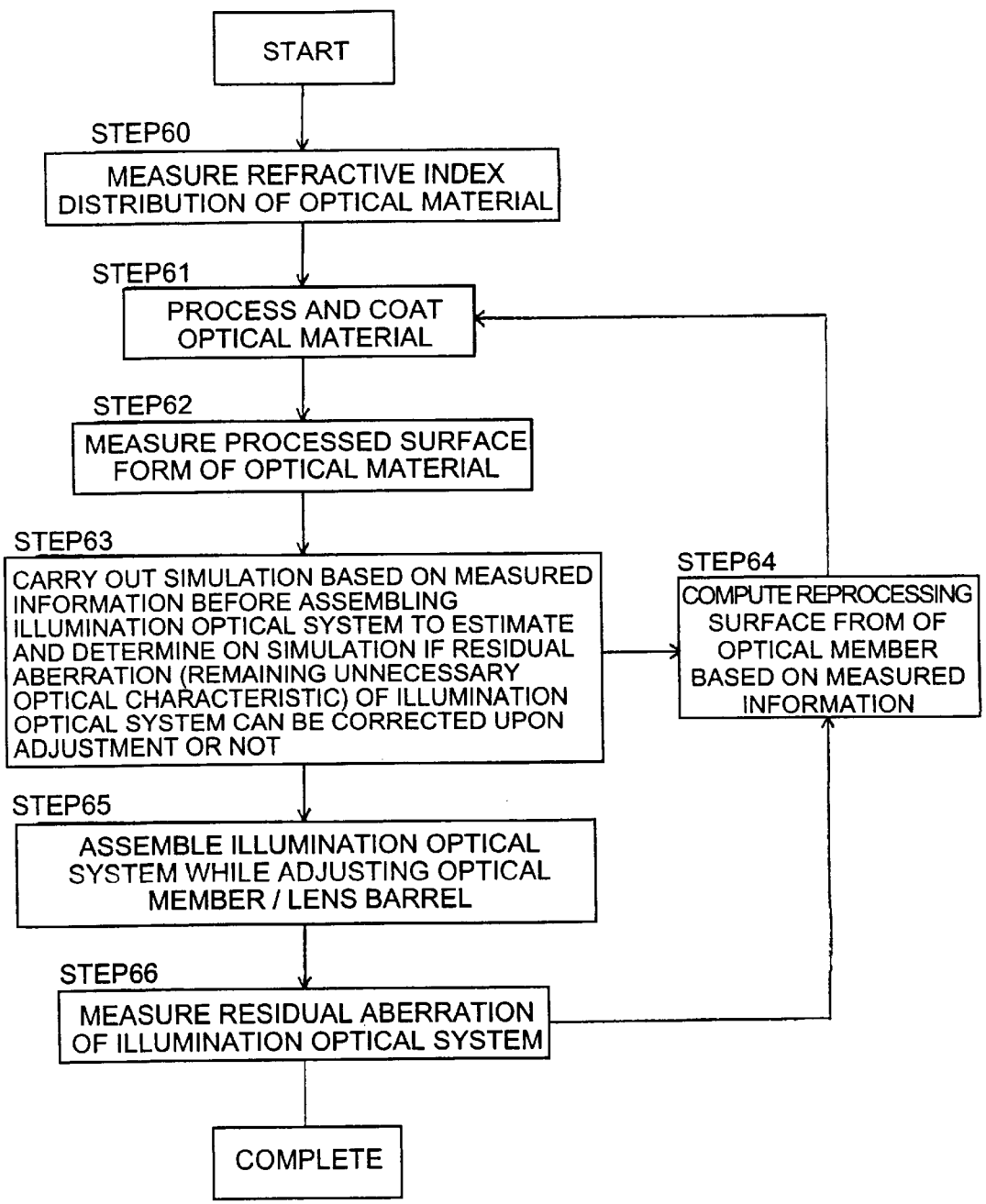
FIG. 15 shows a flowchart showing still another technique of making an illumination optical system.

With reference to FIG. 15, an example in which the technique shown in FIG. 10 is applied to the method of making the illumination optical system IS will now be explained.

While the embodiment shown in FIG. 14 shows an example in which whether to reprocess a processed surface or not is determined by a computer simulation after the illumination optical system IS is once assembled, the following embodiment shown in FIG. 15 refers to an example in which a computer simulation estimates whether or not a processed surface is to be reprocessed to such an extent that the residual aberration (unnecessary optical characteristics) can be corrected upon adjustment of the illumination optical system IS before assembling the illumination optical system IS.

As shown in FIG. 15, in step 60, an interferometer for measuring the refractive index distribution is used for measuring the distribution of refractive index in an optical material (dioptric optical member) before processing. Then, the information concerning the distribution of refractive index in the optical material (dioptric optical member) before processing measured by the interferometer for measuring the refractive index distribution is stored into a memory section within a computer. Here, the optical material before processing is an optical glass block (so-called disk member) or the like with a predetermined thickness, before being processed into a lens, cut out from an ingot of optical glass for the lens or the like, or an ingot itself before cutting out the optical glass block.

After the refractive index distribution measuring step concerning the optical member (dioptric optical member) before processing is completed at the foregoing step 60, the flow proceeds to step 61.

In step 61, a lens processing apparatus (optical member processing apparatus) and a lens polishing apparatus (optical member polishing apparatus) are used for processing and polishing a number of optical glass parts cut out from optical glass ingots for lens and the like, and the step of processing and polishing is repeated until thus processed and ground optical members (lens and the like) attain their optical design values and function as optical members constituting the illumination optical system IS (until their manufacturing errors become permissible). If the refractive index distribution of ingot before cutting out optical glass blocks is measured at the foregoing step 60, then a number of optical glass parts are cut out from the optical glass ingot before the step of processing and polishing is carried out in step 61.

Next, the optical members having completed processing and polishing are successively coated with an antireflective film for enhancing their transmittance and the like by a thin-film deposition apparatus, whereby optical members for assembling the projection optical system are made. When step 21 is completed, then the flow proceeds to step 22.

In step 62, an interferometer for measuring the processed surface form of optical member is used for measuring the processed surface form of each optical member in order to obtain information about errors in processing concerning the processed surface of each optical member made in step 61. The information about the processed surface form of each optical member measured by the interferometer for measuring the processed surface form of optical member is stored into the memory section within the computer. If the measurement of processed surfaces concerning all the optical members constituting the illumination optical system IS is completed, then step 62 is completed, and the flow proceeds to step 63. Though the processed surface form of optical member is measured in step 62 after the processed surface of optical member is coated with a predetermined thin film, the processed surface of optical member may be coated with a predetermined thin film after the processed surface form of optical member is measured.

In step 63, according to the individual items of information stored into the memory section within the computer, i.e., the information concerning the distribution of refractive index in optical members (dioptric optical members) before processing obtained in step 60 and the information concerning the processed surface form of each optical member obtained in step 62, the residual aberration (remaining unnecessary optical characteristics) of illumination optical system IS is estimated and calculated by a computer simulation (e.g., optical calculation by ray tracing or the like). Here, the residual aberration of the illumination optical system IS includes wavefront aberration, spherical aberration, astigmatism, curvature of field, coma, distortion, chromatic aberration, and the like. The unnecessary optical characteristics remaining in the illumination optical system IS includes errors in magnification, telecentric errors (errors in inclination with respect to the optical axis of a principal ray), in-homogeneousness in illuminance, and the like in addition to the above-mentioned residual aberration.

As a result of estimation and calculation by the computer, it is determined whether or not the estimated residual aberration (remaining unnecessary optical characteristics) of illumination optical system IS can be corrected by adjustment of the illumination optical system is (positional adjustment including the inclination and shift of optical members, lens barrels, and the like) in step 65, which will be explained later. In other words, in step 63, whether or not the residual aberration (remaining unnecessary optical characteristics) computed at this step can be corrected by the adjustment of low-order aberration upon adjustment of the illumination optical system IS, for example, is determined according to the computer simulation. The information concerning the residual aberration (remaining unnecessary optical characteristics) of illumination optical system IS obtained in step 63 is stored into the memory section within the computer. Preferably, the computer simulation in step 63 is carried out by use of not only the information concerning the distribution of refractive index of optical materials (dioptric optical members) in step 60 and the information concerning the processed surface form of each optical member in step 62, but also the optical design information of the illumination optical system IS currently being made.

If it is estimated in step 63 that the measured residual aberration (remaining unnecessary optical characteristics) cannot be corrected upon adjustment of the illumination optical system IS, then the flow proceeds to step 64. In other words, if it is estimated that there exists higher-order aberration which cannot completely be corrected upon adjustment of the illumination optical system IS, then the flow proceeds to step 64.

In step 64, a correction surface form (spherical surface form, aspheric surface form of rotational symmetry, aspheric surface form of rotational asymmetry, or random aspheric surface form) concerning the processed surface (optical surface) of at least one optical member at an appropriate position capable of correcting the aberration component (unnecessary optical characteristics component) that cannot completely be corrected upon adjustment of the illumination optical system IS is computed according to a computer simulation (e.g., optical calculation by ray tracing or the like). Preferably, the computer simulation in the step of computing the correction surface form in step 64 is carried out by use of not only the information concerning the distribution of refractive index in optical members (dioptric optical members) obtained in step 60 and the information concerning the processed surface form of each optical member obtained in step 62, but also the optical design information of the illumination optical system IS currently being made.

Thereafter, the flow returns to step 61, where the lens processing apparatus (optical member processing apparatus) and lens polishing apparatus (optical member polishing apparatus) are used, according to the information concerning the correction surface form computed in step 24, for processing and polishing the reprocessing surfaces (optical surfaces) of optical members for reprocessing, and coating is carried out for the reprocessing surfaces of optical members for reprocessing; and then steps 62 and 63 are repeated.

If it is estimated instep 63 that the measured residual aberration (remaining unnecessary optical characteristics) can be corrected upon adjustment of the illumination optical system IS, then the flow proceeds to step 65.

In step 25, the optical members subjected to the foregoing step 63 are used for assembling and adjusting the illumination optical system IS, so as to assemble the illumination optical system IS. Here, the adjustment of illumination optical system IS includes the positional adjustment (including the adjustment of the inclination, shift in the optical axis direction, and eccentricity) of a number of optical members and the positional adjustment (including the adjustment of the inclination, shift in the optical axis direction, and eccentricity) of a plurality of divided lens barrels when the illumination optical system IS is constituted by the divided lens barrels.

The foregoing assembling information of illumination optical system IS upon assembling the illumination optical system IS (e.g., positional information (setting information) of relative intervals between individual optical members and relative intervals between lens barrels for holding the individual optical members) is stored into the memory section within the computer. After step 65 is completed, the flow proceeds to step 66.

In step 66, an optical characteristics (imaging performance) of the illumination optical system IS is measured in order to determine whether the residual aberration (remaining unnecessary optical characteristics) of the illumination optical system IS is permissible or not. Here, as in steps 53 and 57 in the example of FIG. 14, the optical characteristics (imaging performance) of illumination optical system IS can be determined by measurement employing an illuminance measuring apparatus, telecentricity measuring apparatus, interferometer, and the like.

If the residual aberration (remaining unnecessary optical characteristics) of the illumination optical system IS is permissible, then the illumination optical system IS is completed. If the residual aberration (remaining unnecessary optical characteristics) of the illumination optical system IS is not permissible, by contrast, then the measured information concerning the residual aberration (remaining unnecessary optical characteristics) of the illumination optical system IS is stored into the memory section within the computer, and the flow proceeds to step 64. Subsequently, a correction surface form (spherical surface form, aspheric surface form of rotational symmetry, aspheric surface form of rotational asymmetry, or random aspheric surface form) concerning the processed surface (optical surface) of at least one optical member at an appropriate position capable of correcting the residual aberration (unnecessary optical characteristics) of illumination optical system IS determined in step 66 is computed. Preferably, the computer simulation in the step of computing the correction surface form in step 64 is carried out by use of not only the information concerning the distribution of refractive index in optical members (dioptric optical members) obtained in step 60, the information concerning the processed surface form of each optical member obtained in step 61, and the information concerning the residual aberration (remaining unnecessary optical characteristics) of illumination optical system IS obtained in step 66, but also the optical design information of the illumination optical system IS being made and the assembling information of illumination optical system IS upon assembling the illumination optical system IS (positional information (setting information) of the individual members including the relative intervals between the optical members, inclination of each optical member, eccentricity of each optical member (deviation in a direction orthogonal to the optical axis), relative intervals between lens barrels for holding the individual optical members, inclination of each lens barrel, eccentricity of each lens barrel (deviation in the direction orthogonal to the optical axis), and the like) in step 65.

Thereafter, steps 61 to 66 are repeated until the residual aberration (remaining unnecessary optical characteristics) of illumination optical system IS becomes permissible. As a result, the illumination optical system IS having an excellent optical performance (imaging performance) can be made eventually. Here, the reprocessing surfaces computed and processed in steps 64 and 61 by way of step 63 or 66 may be all the processed surfaces of a plurality of optical members constituting the illumination optical system Is.

Though the foregoing embodiments shown in FIGS. 2 and 9 to 15 indicate examples mainly using dioptric optical members (such as lens) for their individual optical systems such as projection optical system and illumination optical system, the present invention is also applicable to the case where each optical system has a configuration including not only dioptric optical members but also catoptric optical members (such as plane mirror, convex mirror, and concave mirror) as a matter of course. In this case, for example, in the embodiments shown in FIGS. 9 to 15, it is preferred that the simulation be carried out after not only the form of processed surfaces of dioptric optical members but also the form of reflective surfaces (processed surfaces) of catoptric optical members is taken into consideration in the process of measuring the processed surface form.

If the exposure apparatus made by the respective methods of the above-mentioned embodiments shown in FIGS. 1, 2, and 9 to 15 are used, then a predetermined circuit pattern can be formed on a wafer or the like acting as a photosensitive substrate, whereby a semiconductor device can be obtained as a micro device. Therefore, an example of techniques for yielding a semiconductor device as a micro device will be explained with reference to the flowchart of FIG. 16.

Figure 16:
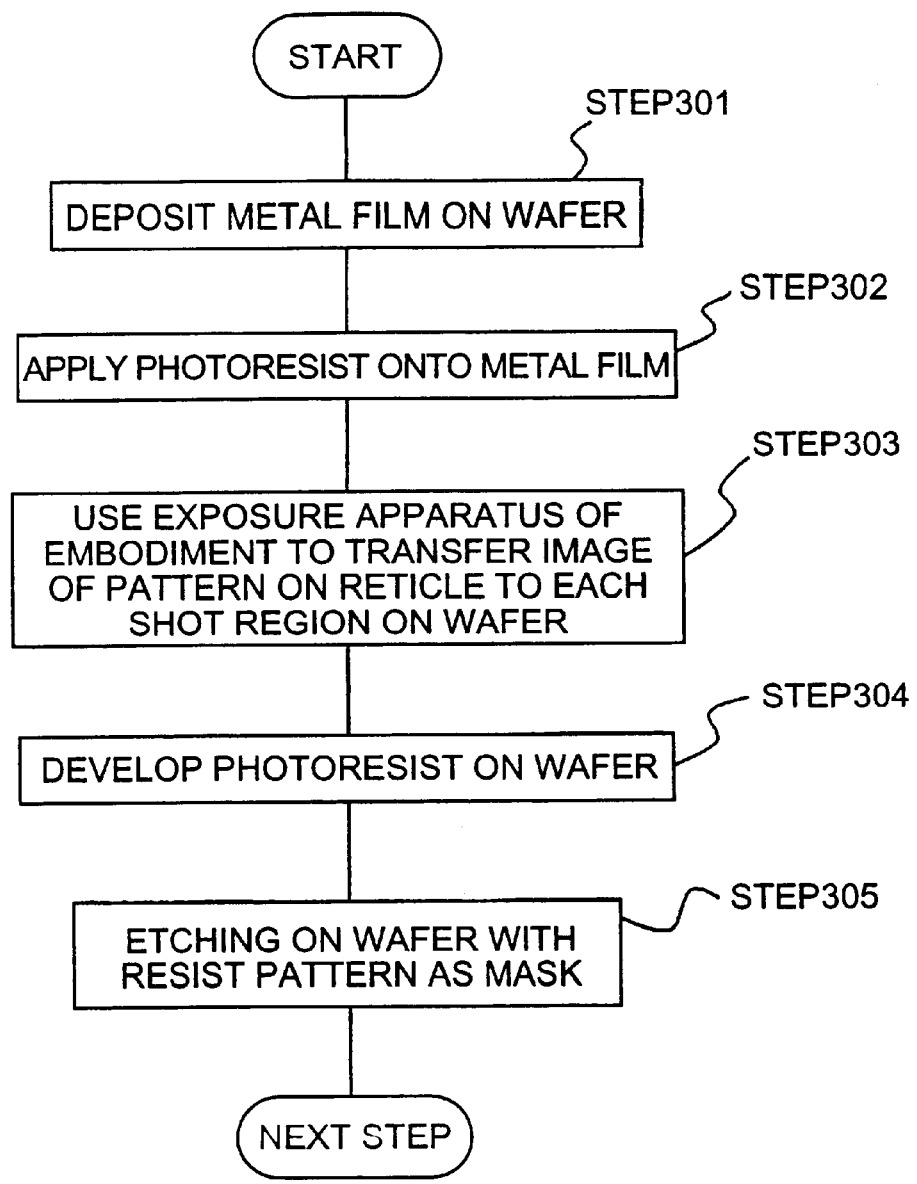
FIG. 16 shows a flowchart showing a method of making a semiconductor device as a micro device.

First, in step 301 of FIG. 16, a metal film is deposited on one lot of wafers. At the next step 302, a photoresist is applied onto the metal film on the one lot of wafers. Thereafter, in step 303, any of the projection exposure apparatus shown in FIGS. 1 and 9 is used such that, by way of its projection optical system PL, an image of a pattern on a mask (reticle) R is successively exposed and transferred to individual shot regions on the one lot of wafers W. Subsequently, the photoresist on the one lot of wafers is developed in step 304, and then etching is carried out on the one lot of wafers with the resist pattern used as a mask in step 305, whereby a circuit pattern corresponding to the pattern on the mask R is formed in each shot region of the respective wafer W. Thereafter, circuit patterns of upper layers are formed, and so forth, whereby a device such as a semiconductor device is made.

According to the above-mentioned method of making a semiconductor device, semiconductor devices having a very fine circuit pattern can be obtained with a favorable throughput.

Also, if the exposure apparatus made by the respective methods of the above-mentioned embodiments shown in FIGS. 1, 2, and 9 to 15 are used, then a predetermined circuit pattern can be formed on a plate (glass substrate), whereby a liquid crystal display device can be obtained as a micro device. Hence, an example of techniques for yielding a liquid crystal display device as a micro device will be explained with reference to the flowchart of FIG. 17.

Figure 17:
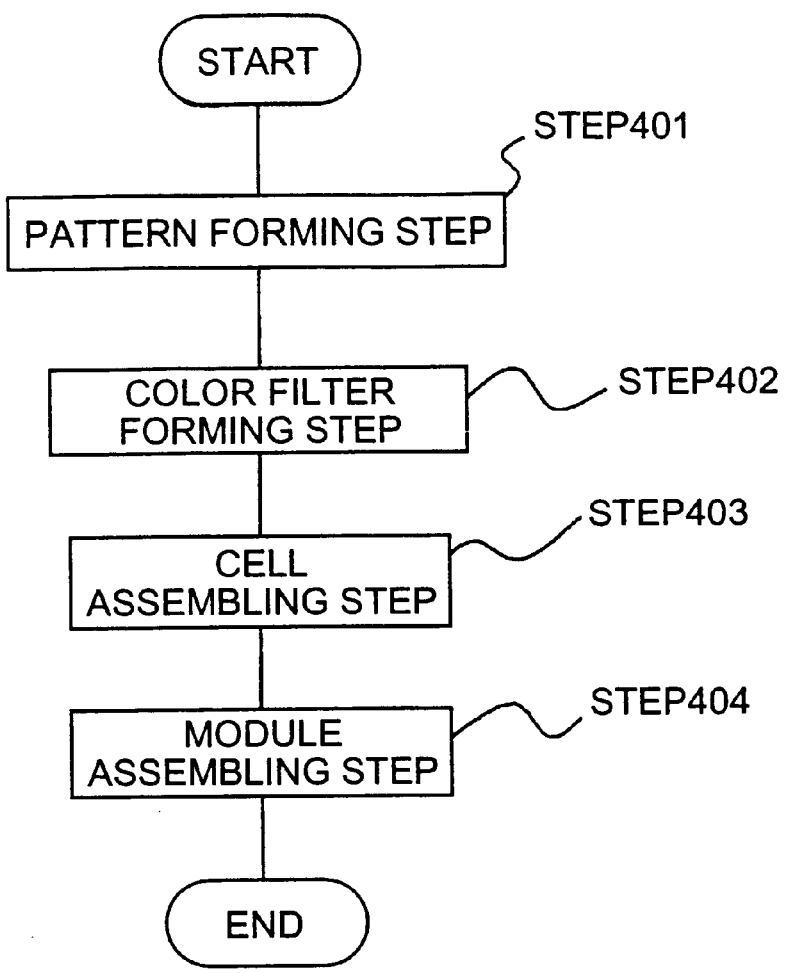
FIG. 17 shows a flowchart showing a method of making a liquid crystal display device as a micro device.

In FIG. 17, at pattern forming step 401, the exposure apparatus of any of the above-mentioned embodiments is used so as to carry out a so-called photolithography step, in which a reticle pattern is transferred and exposed to a photosensitive substrate (a glass substrate coated with a resist, or the like). As a result of this photolithography step, a predetermined pattern including a number of electrodes and the like are formed on the photosensitive substrate. Thereafter, the exposed substrate is subjected to respective steps for developing, etching, peeling off the reticle, and so forth, whereby a predetermined pattern is formed on the substrate; and the flow shifts to its subsequent color filter forming step 402.

At the color filter forming step 402, a color filter in which a number of three-dot groups each corresponding to R (Red), G (Green), and B (Blue) are arranged in a matrix is formed. After the color filter forming step 402, cell assembling step 403 is carried out.

At the cell assembling step 403, the substrate having the predetermined pattern obtained at pattern forming step 401, the color filter obtained at color filter forming step 402, and the like are used for assembling a liquid crystal panel (liquid crystal cell). For example, at the cell assembling step 403, a liquid crystal is injected between the substrate having the predetermined pattern obtained at pattern forming step 401 and the color filter obtained at color filter forming step 402, so as to make a liquid crystal panel (liquid crystal cell).

Thereafter, at module assembling step 404, components such as an electric circuit for causing thus assembled liquid crystal panel (liquid crystal cell) to carry out a display operation and a back light are attached to the liquid crystal panel, so as to complete a liquid crystal display device.

According to the above-mentioned method of making a liquid crystal display device, liquid crystal display devices having a very fine circuit pattern can be obtained with a favorable throughput.

According to the present invention, as in the foregoing, projection optical systems, illumination optical systems, and exposure apparatus, using one or a plurality of optical members such as lens having in-homogeous refractive index, capable of securing required optical performances can be obtained. Therefore, the cost for making projection optical systems, illumination optical systems, and exposure apparatus can be cut down greatly. Also, if exposure methods and methods of making micro devices are carried out by use of these apparatus, quite favorable micro devices with a low yield can be obtained.

What is claimed is:

1. A projection optical system for projecting and transferring a pattern on a mask onto a photosensitive substrate:

the projection optical system using one or a plurality of lenses whose radial refractive index about an optical axis is heterogeneous, and having one or a plurality of aspheric surfaces for correcting an aberration caused by the heterogeneousness of refractive index in the lenses.

2. The projection optical system according to claim 1, wherein each of the lenses with the heterogeneous refractive index has the following relationship:

$$n_{max} - n_{min} > 1 \times 10^{-7}$$

where $n_{max}$ is the maximum value of refractive index, and $n_{min}$ is the minimum value of refractive index.

3. The projection optical system according to claim 1, wherein the projection optical system is constituted, successively from the mask side, by a first lens group having a positive refracting power, a second lens group having a negative refracting power, a third lens group having a positive refracting power, a fourth lens group having a negative refracting power, a fifth lens group having a positive refracting power, and a sixth lens group having a positive refracting power.

4. The projection optical system according to claim 3, wherein at least one of a lens surface of a lens belonging to the first lens group and a lens surface of the lens disposed closest to the first lens group in the second lens group is formed by the aspheric surface and satisfies the following condition:

$$|Df-Db| > 0.1$$

where $Df = Rf \cdot \sin wf \cdot \lambda/(NA \cdot Y_{max})$;

$Db = Rb \cdot \sin wb \cdot \lambda/(NA \cdot Y_{max})$;

Rf is the radius of the wavefront form with respect to the maximum image height concerning a system in which the aspheric surface is replaced by a spherical surface (absolute amount of image plane incident angle);

wf is the incident azimuth of the wavefront form with respect to the maximum image height concerning the system in which the aspheric surface is replaced by a spherical surface;

Rb is the radius of the wavefront form with respect to the maximum image height concerning a system employing the aspheric surface (absolute amount of image plane incident angle);

wb is the incident azimuth of the wavefront form with respect to the maximum image height concerning the system in which the aspheric surface is employed;

$\lambda$ is the wavelength in use;

NA is the maximum numerical aperture on the image side; and $Y_{max}$ is the maximum image height.

5. The projection optical system according to claim 3, wherein at least one of a lens surface of a lens belonging to the second lens group and a lens surface of the lens disposed closest to the second lens group in the third lens group is formed by the aspheric surface and satisfies the following condition:

$$|Af-Ab| > 0.02$$

where $Af = (4Rf^4 - 3Rf^2) \cos 2wf \cdot \lambda/(NA \cdot Y_{max})$;

$Ab = (4Rb^4 - 3Rb^2) \cos 2wb \cdot \lambda/(NA \cdot Y_{max})$;

Rf is the radius of the wavefront form with respect to the maximum image height concerning a system in which the aspheric surface is replaced by a spherical surface (absolute amount of image plane incident angle);

wf is the incident azimuth of the wavefront form with respect to the maximum image height concerning the system in which the aspheric surface is replaced by a spherical surface;

Rb is the radius of the wavefront form with respect to the maximum image height concerning a system employing the aspheric surface (absolute amount of image plane incident angle);

wb is the incident aximuth of the wavefront form with respect to the maximum image height concerning the system in which the aspheric surface is employed;

$\lambda$ is the wavelength in use;

NA is the maximum numerical aperture on the image side; and $Y_{max}$ is the maximum image height.

6. The projection optical system according to claim 3, wherein at least one lens surface of lenses belonging to the third and fourth lens groups is formed by the aspheric surface and satisfies the following condition:

$$|Cf-Cb| > 0.06$$

where $Cf = (10Rf^5 - 12Rf^3 + 3Rf) \sin wf \times \lambda/(NA \cdot Y_{max})$;

$Cb = (10Rb^5 - 12Rb^3 + 3Rb) \sin wb \times \lambda/(NA \cdot Y_{max})$;

Rf is the radius of the wavefront form with respect to the maximum image height concerning a system in which the aspheric surface is replaced by a spherical surface (absolute amount of image plane incident angle);

wf is the incident azimuth of the wavefront form with respect to the maximum image height concerning the system in which the aspheric surface is replaced by a spherical surface;

Rb is the radius of the wavefront form with respect to the maximum image height concerning a system employing the aspheric surface (absolute amount of image plane incident angle);

wb is the incident azimuth of the wavefront form with respect to the maximum image height concerning the system in which the aspheric surface is employed;

$\lambda$ is the wavelength in use;

NA is the maximum numerical aperture on the image side; and $Y_{max}$ is the maximum image height.

7. The projection optical system according to claim 3, wherein at least one lens surface of lenses belonging to the fifth and sixth lens groups is formed by the aspheric surface and satisfies the following condition:

$$|Sf-Sb|>0.02$$

where $Sf=(20Rf^6-30Rf^4+12Rf^2-1)\cdot\lambda/(NA\cdot Y_{max})$;

$Sb=(20Rb^6-30Rb^4+12Rb^2-1)\cdot\lambda/(NA\cdot Y_{max})$;

Rf is the radius of the wavefront form with respect to the maximum image height concerning a system in which the aspheric surface is replaced by a spherical surface (absolute amount of image plane incident angle);

wf is the incident azimuth of the wavefront form with respect to the maximum image height concerning the system in which the aspheric surface is replaced by a spherical surface;

Rb is the radius of the wavefront form with respect to the maximum image height concerning a system employing the aspheric surface (absolute amount of image plane incident angle);

wb is the incident azimuth of the wavefront form with respect to the maximum image height concerning the system in which the aspheric surface is employed;

$\lambda$ is the wavelength in use;

NA is the maximum numerical aperture on the image side; and $Y_{max}$ is the maximum image height.

8. A method of making a projection optical system for projecting an image of a predetermined pattern formed on a mask onto a photosensitive substrate, the method having:

a first step of measuring a heterogeneousness in refractive index of a plurality of refractive optical members;

a second step of calculating an aberration generated by a refractive optical member having a heterogeneousness in refractive index;

a third step of computing an aspheric surface form which can correct the aberration calculated by the second step;

a fourth step of giving the aspheric surface form computed by the third step to the refractive optical member; and a fifth step of assembling the refractive optical members.

9. The method according to claim 8, wherein the heterogeneousness in refractive index is a radial refractive index distribution about an optical axis, and wherein the aspheric surface form has rotational symmetry about the optical axis.

10. A method of making a projection optical system for projecting an image of a predetermined pattern formed on a mask onto a photosensitive substrate, the method including:

a first measuring step of measuring a heterogeneousness in refractive index of a plurality of refractive optical members;

a processing step of processing the plurality of refractive optical members after the first measuring step;

a second measuring step of measuring a processed surface form of the plurality of refractive optical members after the processing step;

an assembling step of assembling the projection optical system by using the plurality of refractive optical members after the second measuring step;

a third measuring step of measuring an unnecessary optical characteristic remaining in the projection optical system after the assembling step;

a computing step of computing a correction surface form concerning at least one processed surface in the plurality of refractive optical members according to respective items of measurement information obtained by the first, second, and third measuring steps in order to correct the unnecessary optical characteristic remaining in the projection optical system;

a reprocessing step of reprocessing at least one processed surface in the plurality of refractive optical members according to information concerning the correction surface form obtained by the computing step; and a finishing step of completing the projection optical system by using a refractive optical member reprocessed by the reprocessing step and a refractive optical member processed by the processing step or by using a refractive optical member reprocessed by the reprocessing step.

11. The method of making a projection optical system according to claim 10, wherein the computing step further computes the correction surface form by using optical design information of the projection optical system.

12. The method of making a projection optical system according to claim 10, wherein the computing step further computes the correction surface form by using assembling information in the assembling step.

13. The method of making a projection optical system according to claim 10, wherein the finishing step includes an adjusting step of adjusting a position of at least one of the plurality of refractive optical members.

14. A method of making an exposure apparatus, the method including:

a step of preparing a projection optical system made by the method of making the projection optical system according to claim 10;

a step of preparing an illumination optical system for illuminating the mask; and a step of installing the illumination optical system and the projection optical system at predetermined positions such that the mask is illuminated by the illumination optical system and that the image of the predetermined pattern formed on the mask is projected onto the photosensitive substrate by the projection optical system.

15. A method of making a projection optical system for projecting an image of a predetermined pattern formed on a mask onto a photosensitive substrate, the method including:

a first measuring step of measuring a heterogeneousness in refractive index of a plurality of refractive optical members;

a processing step of processing the plurality of refractive optical members after the first measuring step;

a second measuring step of measuring a processed surface form of the plurality of refractive optical members after the processing step;

a computing step of computing a correction surface form concerning at least one processed surface in the plurality of refractive optical members according to respective items of measurement information obtained by the first and second measuring steps in order to correct an unnecessary optical characteristic remaining in the projection optical system which occurs due to the heterogeneousness in refractive index of the plurality of refractive optical members and a processing error in processed surfaces of the plurality of refractive optical members;

a reprocessing step of reprocessing at least one processed surface in the plurality of refractive optical members according to information concerning the correction surface form obtained by the computing step; and a finishing step of completing the projection optical system using a refractive optical member reprocessed by the reprocessing step and a refractive optical member processed by the processing step or by using a refractive optical member reprocessed by the reprocessing step.

16. The method of making a projection optical system according to claim 15, wherein the computing step further computes the correction surface form by using optical design information of the projection optical system.

17. The method of making a projection optical system according to claim 15, wherein the computing step further computes the correction surface form by using assembling information in the assembling step.

18. The method of making a projection optical system according to claim 15, wherein the finishing step includes an adjusting step of adjusting a position of at least one of the plurality of refractive optical members.

19. A method of making an exposure apparatus, the method including:

a step of preparing a projection optical system made by the method of making the projection optical system according to claim 15;

a step of preparing an illumination optical system for illuminating the mask; and a step of installing the illumination optical system and the projection optical system at predetermined positions such that the mask is illuminated by the illumination optical system and that the image of the predetermined pattern formed on the mask is projected onto the photosensitive substrate by the projection optical system.

20. A method of making an illumination optical system for illuminating an original in order to expose an image of a predetermined pattern formed on the original onto a photosensitive substrate, the method including:

a first measuring step of measuring a heterogeneousness in refractive index of a plurality of refractive optical members;

a processing step of processing the plurality of refractive optical members after the first measuring step;

a second measuring step of measuring a processed surface form of the plurality of refractive optical members after the processing step;

an assembling step of assembling the illumination optical system by using the plurality of refractive optical members after the second measuring step;

a third measuring step of measuring an unnecessary optical characteristic remaining in the illumination optical system after the assembling step;

a computing step of computing a correction surface form concerning at least one processed surface in the plurality of refractive optical members according to respective items of measurement information obtained by the first, second, and third measuring steps in order to correct the unnecessary optical characteristic remaining in the illumination optical system;

a reprocessing step of reprocessing at least one processed surface in the plurality of refractive optical members according to information concerning the correction surface form obtained by the computing step; and a finishing step of completing the illumination optical system by using a refractive optical member reprocessed by the reprocessing step and a refractive optical member processed by the processing step or by using a dioptric processing step.

21. A method of making an illumination optical system for illuminating an original in order to expose an image of a predetermined pattern formed on the original onto a photosensitive substrate, the method including:

a first measuring step of measuring a heterogeneousness in refractive index of a plurality of refractive optical members;

a processing step of processing the plurality of refractive optical members after the first measuring step;

a second measuring step of measuring a processed surface form of the plurality of refractive optical members after the processing step;

a computing step of computing a correction surface form concerning at least one processed surface in the plurality of refractive optical members according to respective items of measurement information obtained by the first and second measuring steps in order to correct an unnecessary optical characteristic remaining in the illumination optical system which occurs due to the heterogeneousness in refractive index of the plurality of refractive optical members and a processing error in processed surfaces of the plurality of refractive optical members;

a reprocessing step of reprocessing at least one processed surface in the plurality of refractive optical members according to information concerning the correction surface form obtained by the computing step; and a finishing step of completing the illumination optical system by using a refractive optical member reprocessed by the reprocessing step and a refractive optical member processed by the processing step or by using a refractive optical member reprocessed by the reprocessing step.

22. A method of making an exposure apparatus, the method including:

a step of preparing an illumination optical system made by the method of making the illumination optical system according to claim 20;

a step of preparing a projection optical system for projecting the image of the pattern of the original onto the photosensitive substrate; and a step of installing the illumination optical system and the projection optical system at predetermined positions such that the original is illuminated by the illumination optical system and that the image of the predetermined pattern formed on the original is projected onto the photosensitive substrate by the projection optical system.

23. A method of making a micro device, the method including:
- a preparation step of preparing an exposure apparatus made by the method of making the exposure apparatus according to claim 14;
- an illumination step of illuminating the original by using the illumination optical system;
- an exposure step of exposing the image of the pattern of the original to the photosensitive substrate by using the projection optical system; and
- a development step of developing the photosensitive substrate exposed by the exposure step.

24. A projection optical system made by the method according to claim 10.

25. The method of making a projection optical system according to claim 11, wherein the finishing step includes an adjusting step of adjusting a position of at least one of the plurality of refractive optical members.

26. A method of making an exposure apparatus, the method including:
- a step of preparing a projection optical system made by the method of making the projection optical system according to claim 14;
- a step of preparing an illumination optical system for illuminating the mask; and
- a step of installing the illumination optical system and the projection optical system at predetermined positions such that the mask is illuminated by the illumination optical system and that the image of the predetermined pattern formed on the mask is projected onto the photosensitive substrate by the projection optical system.

27. A projection optical system made by the method according to claim 25.

28. A projection optical system made by the method according to claim 11.

29. The method of making a projection optical system according to claim 12, wherein the finishing step includes an adjusting step of adjusting a position of at least one of the plurality of refractive optical members.

30. A method of making an exposure apparatus, the method including:
- a step of preparing a projection optical system made by the method of making the projection optical system according to claim 29;
- a step of preparing an illumination optical system for illuminating the mask; and
- a step of installing the illumination optical system and the projection optical system at predetermined positions such that the mask is illuminated by the illumination optical system and that the image of the predetermined pattern formed on the mask is projected onto the photosensitive substrate by the projection optical system.

31. A projection optical system made by the method according to claim 29.

32. A method of making an exposure apparatus, the method including:
- a step of preparing a projection optical system made by the method of making the projection optical system according to claim 12;
- a step of preparing an illumination optical system for illuminating the mask; and
- a step of installing the illumination optical system and the projection optical system at predetermined positions such that the mask is illuminated by the illumination optical system and that the image of the predetermined pattern formed on the mask is projected onto the photosensitive substrate by the projection optical system.

33. A projection optical system made by the method according to claim 12.

34. A method of making an exposure apparatus, the method including:
- a step of preparing a projection optical system made by the method of making the projection optical system according to claim 13;
- a step of preparing an illumination optical system for illuminating the mask; and
- a step of installing the illumination optical system and the projection optical system at predetermined positions such that the mask is illuminated by the illumination optical system and that the image of the predetermined pattern formed on the mask is projected onto the photosensitive substrate by the projection optical system.

35. A projection optical system made by the method according to claim 14.

36. A projection optical system made by the method according to claim 15.

37. The method of making a projection optical system according to claim 16, wherein the computing step further computes the correction surface form by using assembling information in the assembling step.

38. A projection optical system made by the method according to claim 37.

39. The method of making a projection optical system according to claim 37, wherein the finishing step includes an adjusting step of adjusting a position of at least one of the plurality of refractive optical members.

40. A method of making an exposure apparatus, the method including:
- a step of preparing a projection optical system made by the method of making the projection optical system according to claim 39;
- a step of preparing an illumination optical system for illuminating the mask; and
- a step of installing the illumination optical system and the projection optical system at predetermined positions such that the mask is illuminated by the illumination optical system and that the image of the predetermined pattern formed on the mask is projected onto the photosensitive substrate by the projection optical system.

41. A method of making a micro device, the method including:
- a preparation step of preparing an exposure apparatus made by the method of making the exposure apparatus according to claim 40;
- an illumination step of illuminating the original by using the illumination optical system;
- an exposure step of exposing the image of the pattern of the original to the photosensitive substrate by using the projection optical system; and
- a development step of developing the photosensitive substrate exposed by the exposure step.

42. A projection optical system made by the method according to claim 39.

43. The method of making a projection optical system according to claim 16, wherein the finishing step includes an adjusting step of adjusting a position of at least one of the plurality of refractive optical members.

44. A method of making an exposure apparatus, the method including:
a step of preparing a projection optical system made by the method of making the projection optical system according to claim 43;
a step of preparing an illumination optical system for illuminating the mask; and
a step of installing the illumination optical system and the projection optical system at predetermined positions such that the mask is illuminated by the illumination optical system and that the image of the predetermined pattern formed on the mask is projected onto the photosensitive substrate by the projection optical system.

45. A projection optical system made by the method according to claim 17.

46. A method of making an exposure apparatus, the method including:
a step of preparing a projection optical system made by the method of making the projection optical system according to claim 17;
a step of preparing an illumination optical system for illuminating the mask; and
a step of installing the illumination optical system and the projection optical system at predetermined positions such that the mask is illuminated by the illumination optical system and that the image of the predetermined pattern formed on the mask is projected onto the photosensitive substrate by the projection optical system.

47. The method of making a projection optical system according to claim 17, wherein the finishing step includes an adjusting step of adjusting a position of at least one of the plurality of refractive optical members.

48. A method of making an exposure apparatus, the method including:
a step of preparing a projection optical system made by the method of making the projection optical system according to claim 47;
a step of preparing an illumination optical system for illuminating the mask; and
a step of installing the illumination optical system and the projection optical system at predetermined positions such that the mask is illuminated by the illumination optical system and that the image of the predetermined pattern formed on the mask is projected onto the photosensitive substrate by the projection optical system.

49. A projection optical system made by the method according to claim 47.

50. A method of making an exposure apparatus, the method including:
a step of preparing a projection optical system made by the method of making the projection optical system according to claim 18;
a step of preparing an illumination optical system for illuminating the mask; and
a step of installing the illumination optical system and the projection optical system at predetermined positions such that the mask is illuminated by the illumination optical system and that the image of the predetermined pattern formed on the mask is projected onto the photosensitive substrate by the projection optical system.

51. A projection optical system made by the method according to claim 18.

52. A method of making a micro device, the method including:
a preparation step of preparing an exposure apparatus made by the method of making the exposure apparatus according to claim 19;
an illumination step of illuminating the original by using the illumination optical system;
an exposure step of exposing the image of the pattern of the original to the photosensitive substrate by using the projection optical system; and
a development step of developing the photosensitive substrate exposed by the exposure step.

53. A projection optical system made by the method according to claim 19.

54. A method of making a micro device, the method including:
a preparation step of preparing an exposure apparatus made by the method of making the exposure apparatus according to claim 22;
an illumination step of illuminating the original by using the illumination optical system;
an exposure step of exposing the image of the pattern of the original to the photosensitive substrate by using the projection optical system; and
a development step of developing the photosensitive substrate exposed by the exposure step.

55. An illumination optical system made by the method according to claim 22.

56. A method of making an exposure apparatus, the method including:
a step of preparing an illumination optical system made by the method of making the illumination optical system according to claim 21;
a step of preparing a projection optical system for projecting the image of the pattern of the original onto the photosensitive substrate; and
a step of installing the illumination optical system and the projection optical system at predetermined positions such that the original is illuminated by the illumination optical system and that the image of the predetermined pattern formed on the original is projected onto the photosensitive substrate by the projection optical system.

57. A method of making a micro device, the method including:
a preparation step of preparing an exposure apparatus made by the method of making the exposure apparatus according to claim 56;
an illumination step of illuminating the original by using the illumination optical system;
an exposure step of exposing the image of the pattern of the original to the photosensitive substrate by using the projection optical system; and
a development step of developing the photosensitive substrate exposed by the exposure step.

58. An illumination optical system made by the method according to claim 21.

59. An exposure apparatus for projecting a predetermined pattern on a mask onto a photosensitive substrate, comprising:
an illumination optical system for illuminating the mask; and a projection optical system made by the method according to claim 1, for projecting an image of the pattern of the mask onto the photosensitive substrate.

60. An exposure apparatus for projecting a predetermined pattern on a mask onto a photosensitive substrate, comprising:

an illumination optical system for illuminating the mask; and a projection optical system made by the method according to claim 2, for projecting an image of the pattern of the mask onto the photosensitive substrate.

61. A method of projecting a predetermined pattern on a mask onto a photosensitive substrate, comprising the steps of:

illuminating the mask; and projecting an image of the pattern of the mask onto the photosensitive substrate by using a projection optical system made by the method according to claim 1.

62. A method of projecting a predetermined pattern on a mask onto a photosensitive substrate, comprising the steps of:

illuminating the mask; and projecting an image of the pattern of the mask onto the photosensitive substrate by using a projection optical system made by the method according to claim 2.

63. The method of making a projection optical system according to claim 11, wherein the computing step further computes the correction surface form by using assembling information in the assembling step.

64. The method of making a projection optical system according to claim 63, wherein the finishing step includes an adjusting step of adjusting a position of at least one of the plurality of refractive optical members.

65. A method of making an exposure apparatus, the method including:

a step of preparing a projection optical system made by the method of making the projection optical system according to claim 64;

a step of preparing an illumination optical system for illuminating the mask; and a step of installing the illumination optical system and the projection optical system at predetermined positions such that the mask is illuminated by the illumination optical system and that the image of the predetermined pattern formed on the mask is projected onto the photosensitive substrate by the projection optical system.

66. A projection optical system made by the method according to claim 64.

67. A method of making an exposure apparatus, the method including:

a step of preparing a projection optical system made by the method of making the projection optical system according to claim 25;

a step of preparing an illumination optical system for illuminating the mask; and a step of installing the illumination optical system and the projection optical system at predetermined positions such that the mask is illuminated by the illumination optical system and that the image of the predetermined pattern formed on the mask is projected onto the photosensitive substrate by the projection optical system.

68. The method of making a projection optical system according to claim 11, wherein the finishing step includes an adjusting step of adjusting a position of at least one of the plurality of refractive optical members.

69. A method of making an exposure apparatus, the method including:

a step of preparing a projection optical system made by the method of making the projection optical system according to claim 68;

a step of preparing an illumination optical system for illuminating the mask; and a step of installing the illumination optical system and the projection optical system at predetermined positions such that the mask is illuminated by the illumination optical system and that the image of the predetermined pattern formed on the mask is projected onto the photosensitive substrate by the projection optical system.

70. A projection optical system made by the method according to claim 68.

71. A method of making an exposure apparatus, the method including:

a step of preparing a projection optical system made by the method of making the projection optical system according to claim 11;

a step of preparing an illumination optical system for illuminating the mask; and a step of installing the illumination optical system and the projection optical system at predetermined positions such that the mask is illuminated by the illumination optical system and that the image of the predetermined pattern formed on the mask is projected onto the photosensitive substrate by the projection optical system.

72. A projection optical system made by the method according to claim 13.

73. A method of making an exposure apparatus, the method comprising:

a step of preparing a projection optical system made by the method of making the projection optical system according to claim 37;

a step of preparing an illumination optical system for illuminating the mask; and a step of installing the illumination optical system and the projection optical system at predetermined positions such that the mask is illuminated by the illumination optical system and that the image of the predetermined pattern formed on the mask is projected onto the photosensitive substrate by the projection optical system.

74. A projection optical system made by the method according to claim 43.

75. A method of making an exposure apparatus, the method comprising:

a step of preparing a projection optical system made by the method of making the projection optical system according to claim 8;

a step of preparing an illumination optical system for illuminating the mask; and a step of installing the illumination optical system and the projection optical system at predetermined positions such that the mask is illuminated by the illumination optical system and that the image of the predetermined pattern formed on the mask is projected onto the photosensitive substrate by the projection optical system.

76. A method of making a micro device, the method including:

a preparing step of preparing an exposure apparatus made by the method of making the exposure apparatus according to claim 75;

an illuminating step of illuminating the mask by using the illumination optical system;

an exposure step of exposing the image of the pattern of the mask to the photosensitive substrate by using the projection optical system; and a development step of developing the photosensitive substrate exposed by the exposure step.

77. A projection optical system made by the method according to claim 8.

78. A projection optical system for projecting and transferring a pattern on a first surface onto a second surface, comprising:

one of more lenses including at least one lens with a heterogeneous refractive index; and at least one aspherical surface, formed on a surface of the one or more lenses, which corrects an aberration caused by the heterogeneous refractive index in the at least one lens.

79. The projection optical system according to claim 78, wherein each of the lenses with the heterogeneous refractive index satisfies the following condition:

$$\eta_{max} - \eta_{min} > 1 \times 10^{-7}$$

where $\eta_{max}$ is the maximum value of refractive index, and $\eta_{min}$ is the minimum value of refractive index.

80. The projection optical system according to claim 78, comprising:

a first lens group having a negative refractive power, arranged in an optical path between the first surface and the second surface;

a second lens group having a positive refractive power, arranged in an optical path between the first lens group and the second surface;

a third lens group having a negative refractive power, arranged in an optical path between the second lens group and the second surface; and a fourth lens group having a positive refractive power, arranged in an optical path between the third lens group and the second surface.

81. The projection optical system according to claim 80, further comprising an additional lens group having a positive refractive power arranged in an optical path between the fourth lens group and the second surface.

82. The projection optical system according to claim 81, further comprising another additional lens group having a positive refractive power arranged in an optical path between the first surface and the first lens group.

83. An exposure apparatus for projecting a predetermined pattern on a mask onto a photosensitive substrate, comprising:

an illumination optical system for illuminating the mask; and a projection optical system according to claim 78, for projecting an image of the pattern on the mask onto the photosensitive substrate.

84. A method of projecting a predetermined pattern on a mask onto a photosensitive substrate, comprising the steps of:

illuminating the mask; and projecting an image of the pattern on the mask onto the photosensitive substrate by using a projection optical system according to claim 78.

* * * * *